(12) United States Patent
Samuel et al.

(10) Patent No.: US 6,558,818 B1
(45) Date of Patent: May 6, 2003

(54) LIGHT-EMITTING DENDRIMERS AND DEVICES

(75) Inventors: Ifor David Samuel, Durham (GB); Mounir Halim, Durham (GB); Paul Leslie Burn, Durham (GB); Jonathan Nigel Pillow, Durham (GB)

(73) Assignee: Isis Innovation Ltd., Oxford (GB)

( * ) Notice: Subject to any disclaimer, the term of this patent is extended or adjusted under 35 U.S.C. 154(b) by 0 days.

(21) Appl. No.: 09/530,025

(22) PCT Filed: Oct. 23, 1998

(86) PCT No.: PCT/GB98/03172

§ 371 (c)(1),
(2), (4) Date: Jul. 11, 2000

(87) PCT Pub. No.: WO99/21935

PCT Pub. Date: May 6, 1999

(30) Foreign Application Priority Data

Oct. 23, 1997 (GB) ............................................. 9722347
Dec. 19, 1997 (GB) ............................................. 9726929

(51) Int. Cl.⁷ .......................... C07C 15/00; H05B 33/14
(52) U.S. Cl. ....................... 428/690; 428/917; 428/704; 313/504; 313/506; 585/19; 585/25; 585/27
(58) Field of Search ................................ 428/690, 917, 428/704; 313/504, 506; 585/19, 25, 27

(56) References Cited

FOREIGN PATENT DOCUMENTS

| DE | 19541113 | 4/1997 |
| EP | 516409 | 12/1992 |
| JP | 9268284 | 10/1997 |

OTHER PUBLICATIONS

Deb et al. (J. Am. Chem. Soc. 1997, 119, 9079–9080).*
S. Deb et al., A Simple Orthogonal Approach To Poly(phenylenevinylene) Dendrimers, 119 J. Am. Chem. Soc. 9079–9080 (1997) No month.

P. Wang et al., Electroluminescent Diodes From A Single–Component Emitting Layer Of Dendritic Macromolecules, 8 Advanced Materials 237–241 (1996) No month.

J. Bettenhauser et al., Dendrimers With 1,3,4–oxadiazole Units, 1, 17 Macromol. Rapid Commun. 623–631 (1996) No month.

P. Burns et al., Chemical Tuning Of The Electronic Properties Of Poly(p–phenylenevinylene)–Based Copolymers, 115 J. Am. Chem. Soc. 10117–10124 (1993) No month.

J. Issberner et al., Dendrimers: From Generations And Functional Groups To Functions, 33 Angewandte Chemie. 2413–2420 (1994) No month.

* cited by examiner

*Primary Examiner*—Deborah Jones
*Assistant Examiner*—Ling Xu
(74) *Attorney, Agent, or Firm*—Quarles & Brady LLP

(57) ABSTRACT

Light emitting compounds are disclosed for use in light emitting devices. These compounds have the formula A compound having the formula:

$$\text{CORE-[DENDRITE]}_n$$

in which CORE represents an atom or group, n represents an integer of at least 1 and DENDRITE, which may be the same or different if n is greater than 1, represents an inherently at least partly conjugated dendritic molecular structure comprising aryl and/or heteroaryl groups and alkenyl groups connected to each other via a carbon atom of an alkenyl group to a ring carbon atom of an aryl or heteroaryl group, CORE terminating in the first single bond which is connected to a ring carbon atom of an (hetero)aryl group to which more than one at least partly conjugated dendritic chain is attached, said ring carbon atom forming part of DENDRITE, the CORE and/or DENDRITE being luminescent.

23 Claims, 16 Drawing Sheets

SYNTHESIS OF 2ND GENERATION ANTHRACENE DENDRIMER

SYNTHESIS OF 2ND GENERATION DISTYRYLBENZENE DENDRIMER

SYNTHESIS OF 2ND GENERATION PORPHYRIN DENDRIMER

3RD GENERATION DISTYRYLBENZENE DENDRIMER (70%)

LIGHT-EMITTING DENDRIMERS AND DEVICES

FIELD OF THE INVENTION

This invention relates to light-emitting dendrimers and devices using them and methods for their synthesis and construction.

BACKGROUND OF THE INVENTION

It has been clearly demonstrated that conjugated organic materials, including linear (co)polymers, oligomers, and molecular materials show considerable promise as the light-emitting layers in light-emitting diodes (LEDs) (J. H. Burroughs et al, Nature, 1990, 347, 539). However, to reach their full potential, a number of problems need to be overcome including achievement of the necessary emission colours (particularly blue and red), optimisation of chromophoric efficiency together with processing properties, and extension of device operational lifetime. The simplest organic-based LEDs have the organic light-emitting layer sandwiched between an anode, which injects holes, and a cathode, which injects electrons, with one or both of the electrodes being clear to allow the emission of light from the device. Most light-emitting conjugated materials tend to transport holes in preference to electrons and hence the LEDs which have been developed can incorporate additional charge transport layers in addition to the luminescent layer in an effort to balance the charge injection (A. R. Brown et al, Chem. Phys. Lett., 1992, 200, 46). The problem with using linear (co)polymers for such devices is that changes to the structure of the linear (co)polymer designed to change the electronic properties of the linear (co)polymer may then also change the synthetic procedure as well as the processing properties of the linear (co)polymers (P. L. Burn et al, J. Am. Chem. Soc., 1993, 115, 10117).

SUMMARY OF THE INVENTION

The present invention addresses the problems encountered with (co)polymers on the basis that dendritic light-emitting molecules will provide a new approach to the molecular engineering of materials for LEDs and tend to have distinct advantages over linear polymers in some or all of these areas, including efficiency, colour control, and processing.

Dendrimers are typically represented by a core (rectangle), dendritic branches including conjugated units (circles and triangles) and including branch links (L), and surface groups (S), of general structure shown in the accoumpanying FIG. 9. The branch links (L) can be a simple bond or bonds.

The dendrimers according to the present invention which can be used for incorporation into light emitting devices have a core and/or branches comprising electroluminescent or charge-transporting chromophores (conjugated units). The conjugated units used for the core and/or the branches need not be the same. The importance of each component of the dendrimer will be discussed below.

There have been many investigations into the synthetic procedures for the preparation of dendrimers. The dendrimers according to the invention may be synthesised by any convenient method, including both "convergent" and "divergent" methods (Z. Xu et al, J. Am. Chem. Soc., 1994, 116, 4537). In convergent methods the dendritic branches are first synthesised and then bonded to bonding sites on the core, whereas in divergent methods the dendritic branches are progressively built up from the core bonding sites.

Light-emitting diodes (LEDs) using as light-emitting element dendrimers having an anthracene core linked by acetylene(ethynyl) linkages to acetylene-linked 3,5-t-butylphenyl dendritic structures have been described by Jeffrey S. Moore et al in Adv. Mater. 1996, 8, No. 3, pp 237–241. Those dendrimers are believed not to be very efficient for the present purposes. Bettenhausen and Strohriegel, in Macromol. Rapid Commun. 17, 623–631 (1996) describe dendrimers having 1,3,4-oxadiazole linking units for use as electron injection and transport layers (not the light-emitting element) in light emitting devices.

S. K. Deb et al, in J.Am.Chem.Soc. (1997), 119(38), pp 9079–9080, have described reactive attachment of aldehyde-functionalised structures to the 1,3,5-positions of a benzene ring to synthesise poly(phenylenevinylene) dendrimers which are described as fluoroescent. These dendrimer end products, although not light emitting devices containing them, are excluded from the present invention, and so are the functionalised precursor structures.

BRIEF SUMMARY OF THE INVENTION

The present invention provides dendrimers, ways of synthesising them, methods of processing them to make devices, and devices using them, which are believed to be superior to those previously known dendrimers, especially for use in light emitting devices. It is to be understood, for further avoidance of doubt, that the use of the specified dendrimers as a light-emitting element in a light-emitting device encompasses such use of the dendrimers either as the light-emitting element, or in the light-emitting element in the event that the light-emitting element is regarded as including structures or materials in addition to the dendrimers themselves.

One aspect of the invention accordingly provides a luminescent compound of the formula:

in which CORE represents an atom or group, n represents an integer of at least 1 and DENDRITE, which may be the same or different if n is greater than 1, represents an at least partly conjugated dendritic molecular structure comprising groups selected from the group consisting of aryl and heteroaryl groups and alkenyl groups connected to each other via a carbon atom of an alkenyl group to a ring carbon atom of an aryl or heteroaryl group, CORE terminating in a first single bond which is connected to a ring carbon atom of an (hetero)aryl group to which more than one at least partly conjugated dendritic chain is attached, said ring carbon atom of an (hetero)aryl group forming part of DENDRITE. Preferably the compound emits light in the visible region under electrical or optical excitation. The compounds typically have one or more end or surface groups.

In any event, wherein (a) the CORE is not

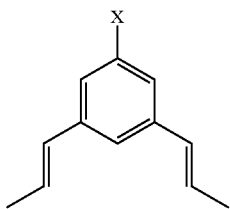

wherein X is bromine or CHO when n=2, (b) the CORE is not bromine or CHO when n=1 and is attached to

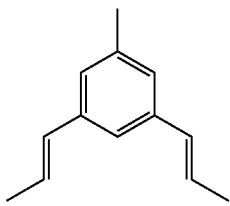

and (c) the CORE does not contain the structure

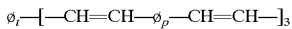

in which $\phi_t$ is a 1,3,5-bonded benzene ring and $\phi_p$ is a para-bonded benzene ring.

Figure 1:
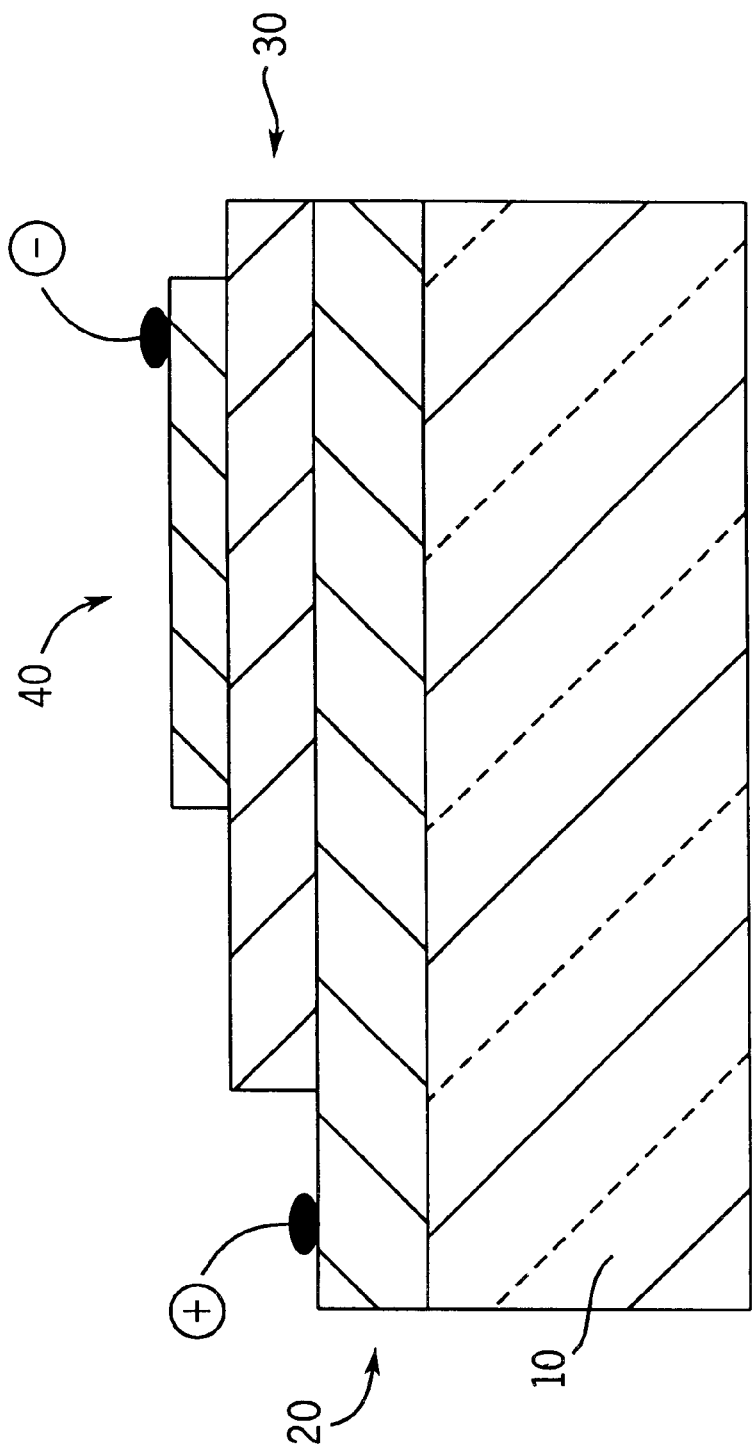
FIG. 1 shows schematically one form of light emitting device comprising a glass substrate 10 coated with a transparent ITO anode 20 overlying which is a layer 30 of dendrimer according to the invention, with a metal cathode 40 of Ca or Al on the dendrimer surface remote from the anode 20.
Figure 2:
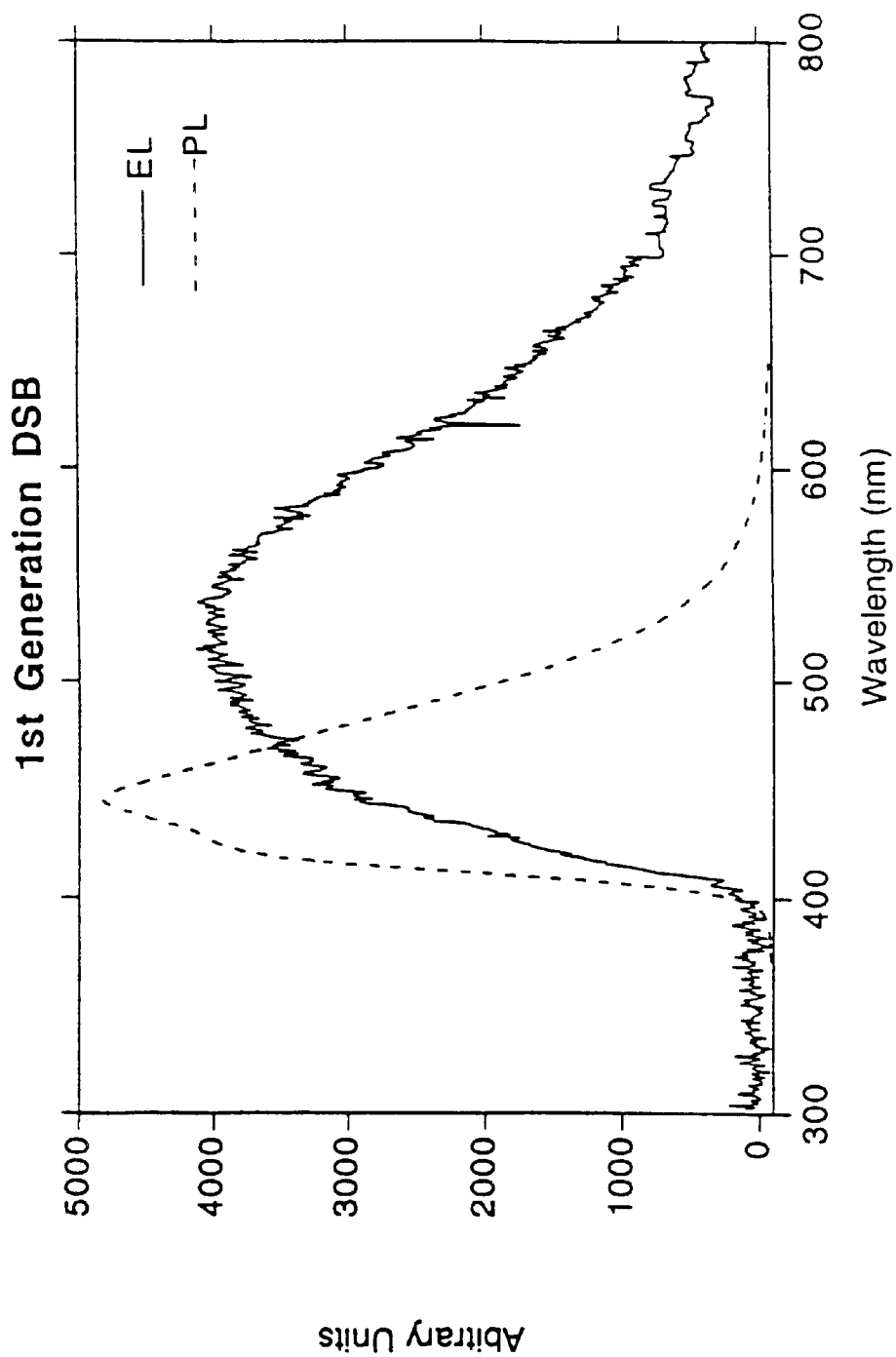
FIG. 2 is a self-explanatory graph comparing the electroluminescence (EL) and photoluminescence (PL) of a first-generation distryrylbenzene dendrimer (1-DSB)
Figure 3:
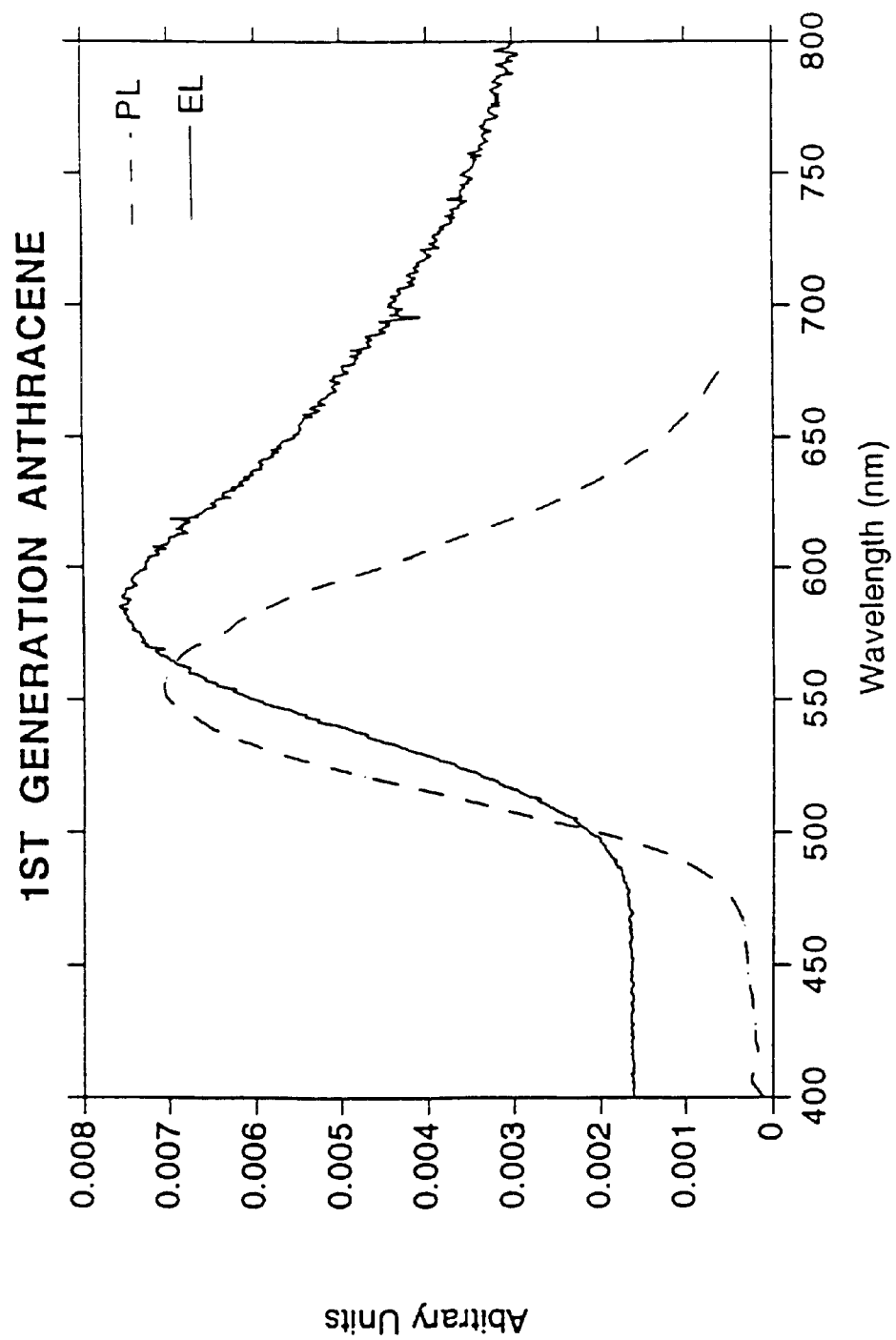
FIG. 3 similarly compares EL and PL spectra (offset for clarity) of a first-generation dendrimer having an anthracene core with stilbene dendritic branches (herein identified as 1-Anthracene)
Figure 4:
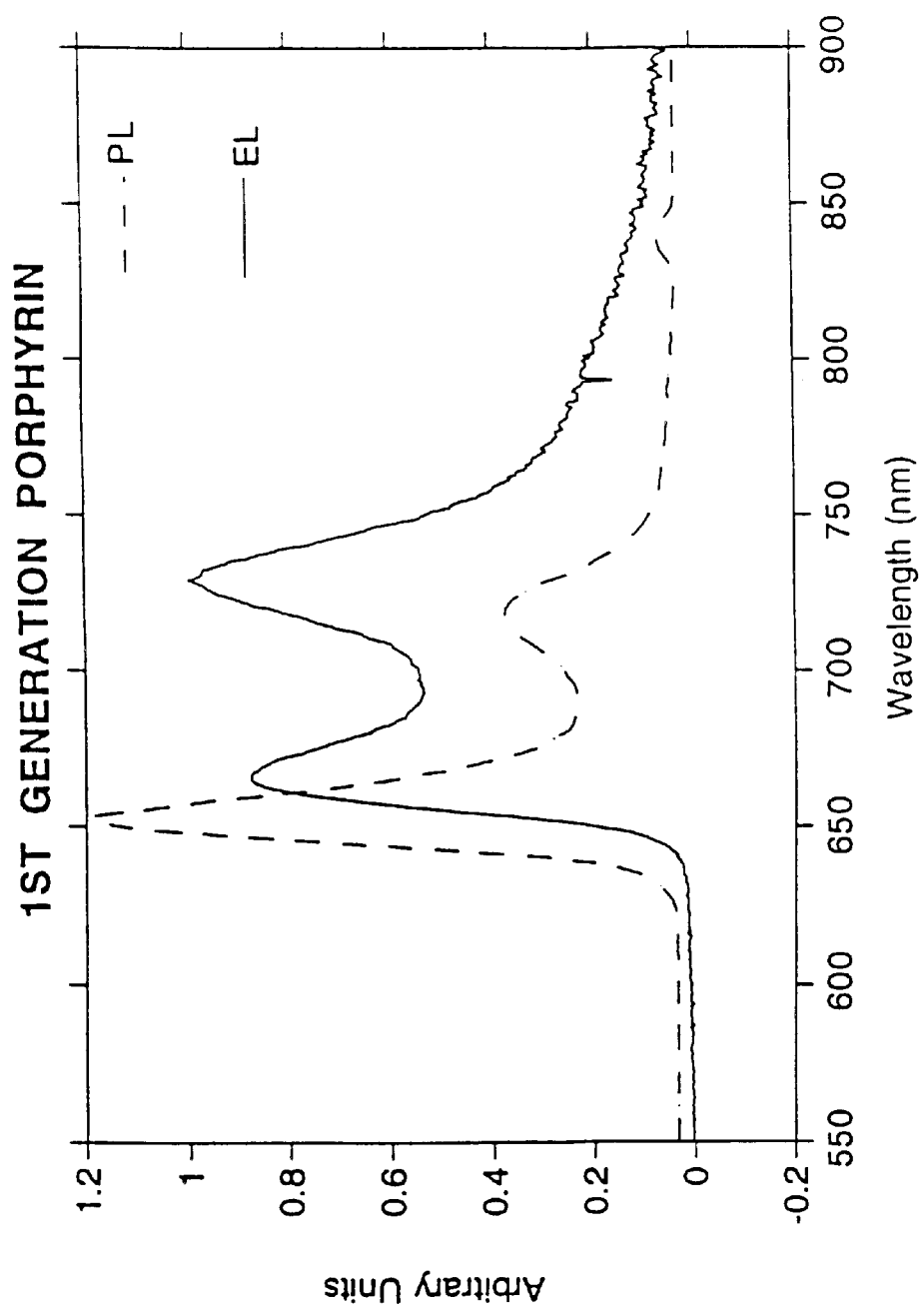
FIG. 4 similarly compares EL and PL of a corresponding first-generation porphyrin-core dendrimer (1-Porphyrin)
Figure 5:
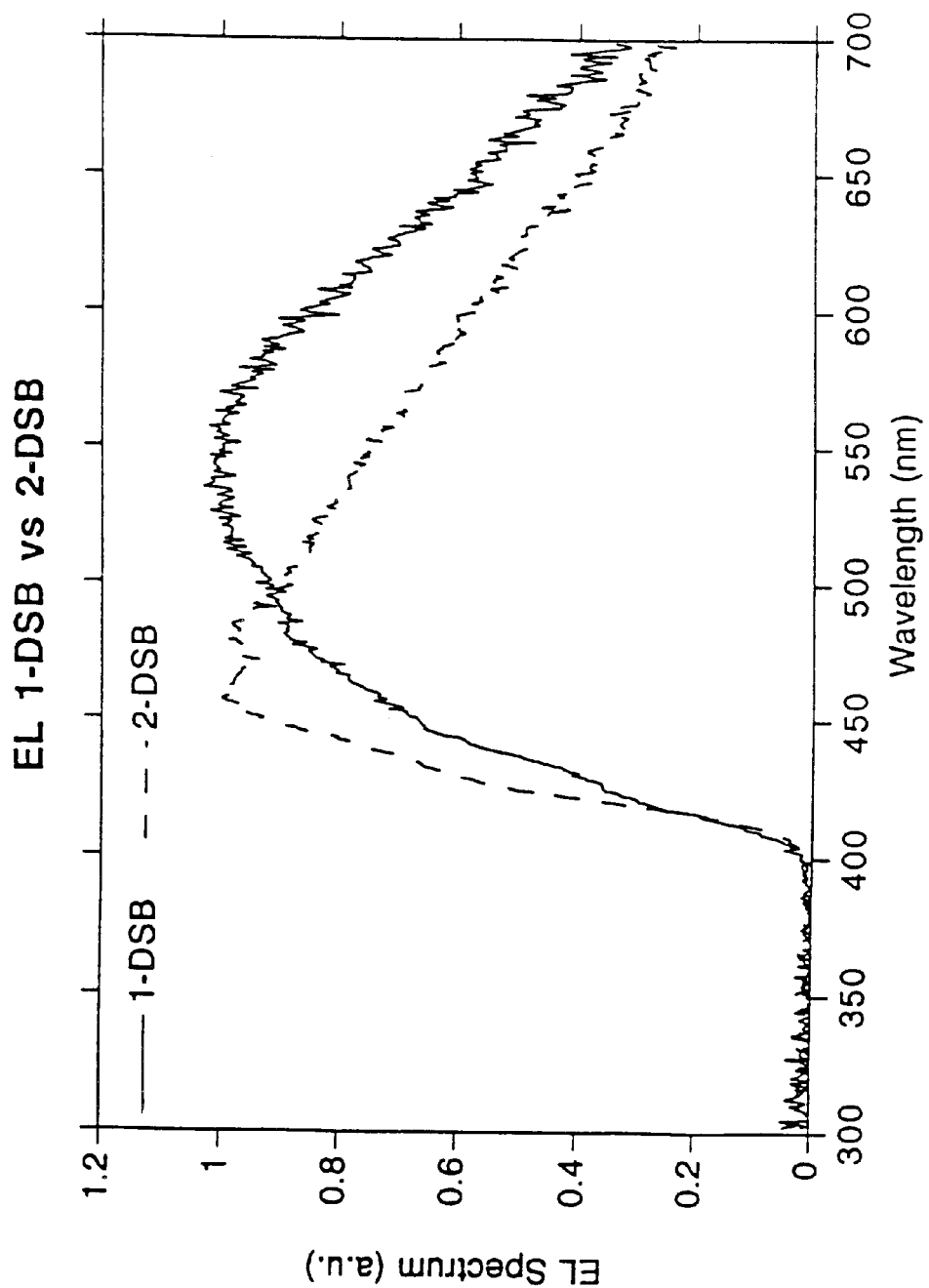
FIG. 5 compares the EL of 1-DSB with that of second-generation 2-DSB.
Figure 6:
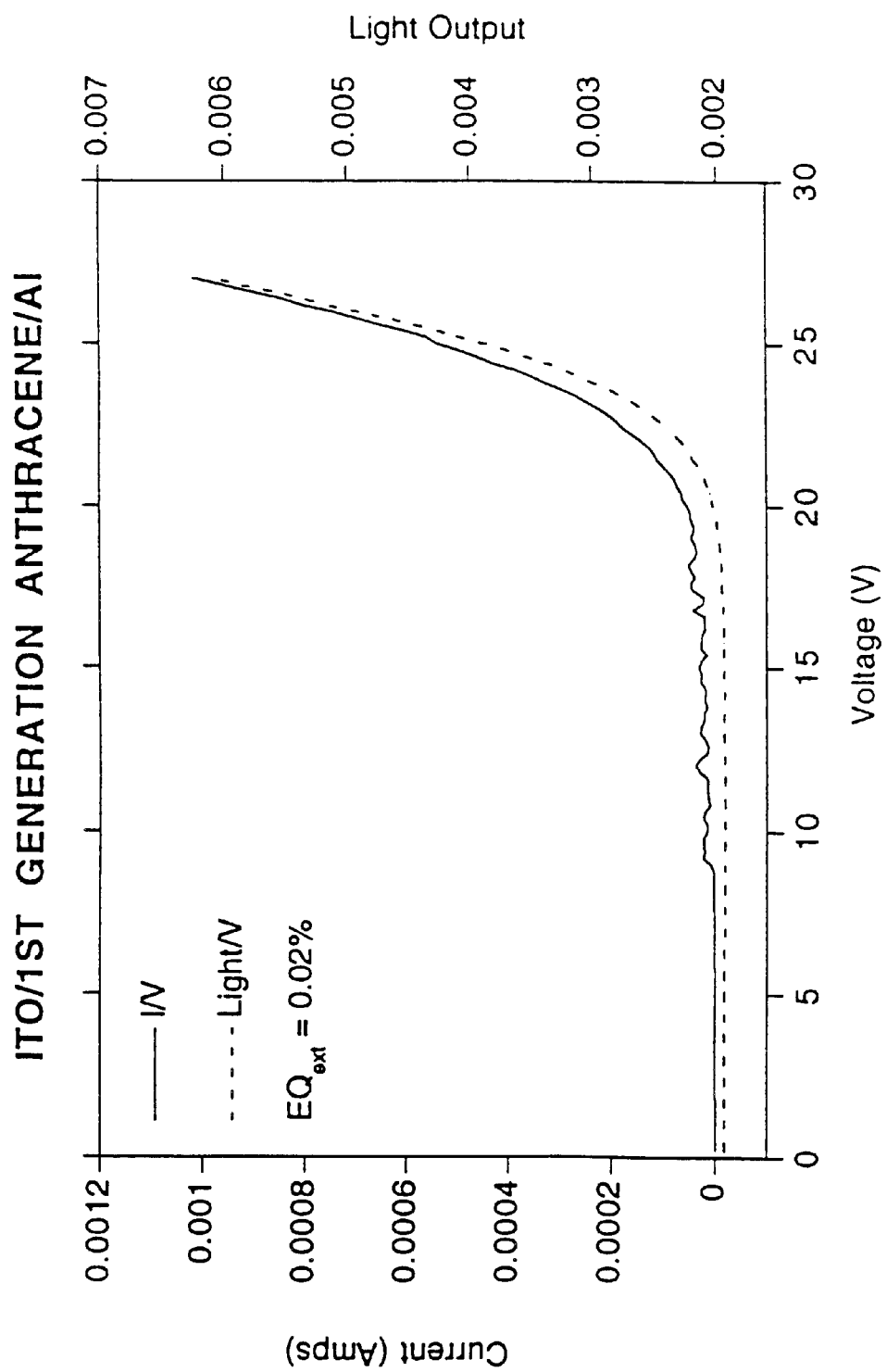
FIG. 6 shows the electrical and light-emitting performance of an LED using 1-Anthracene dendrimer between ITO and Al electrodes.
Figure 7:
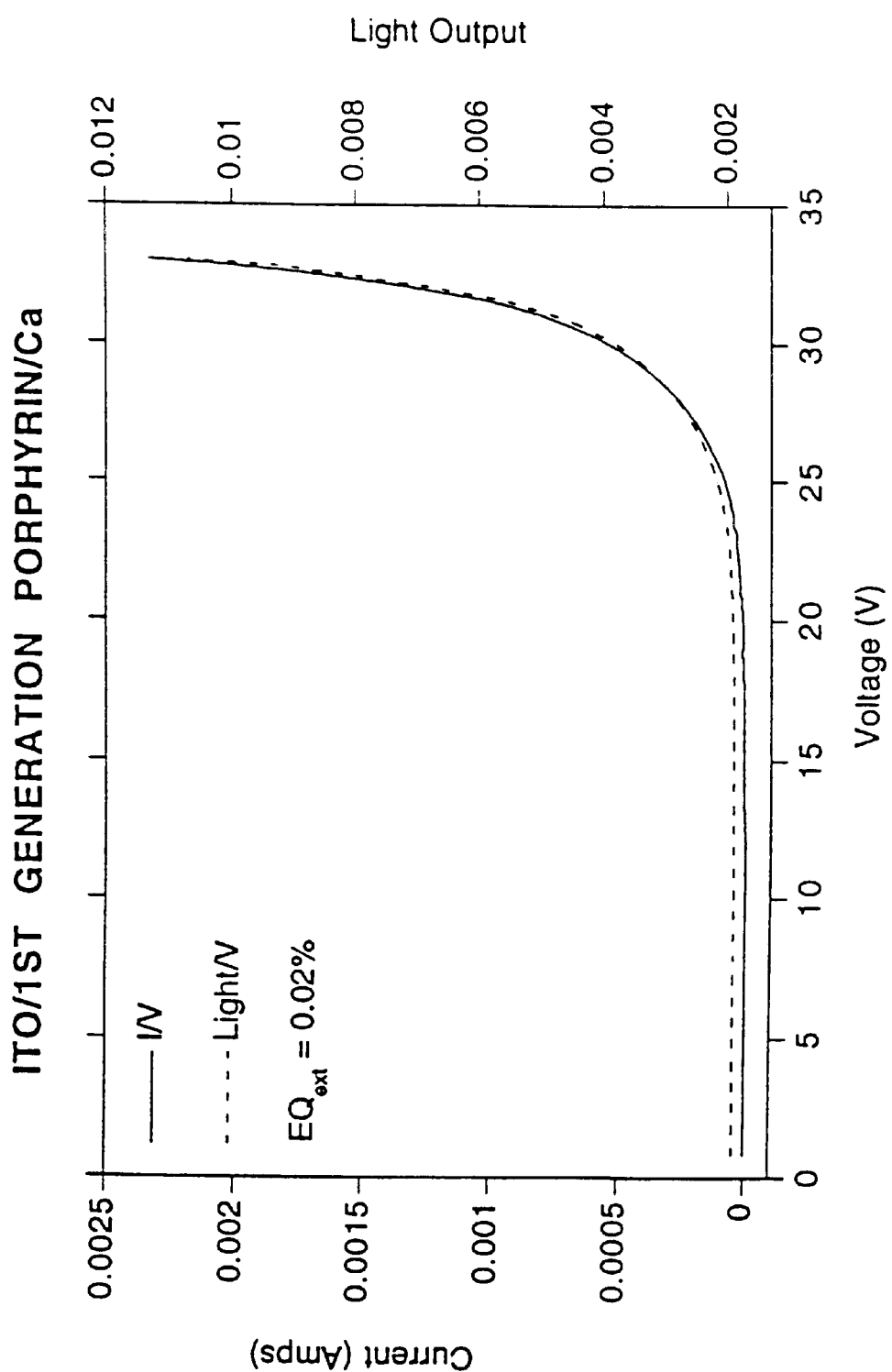
FIG. 7 similarly shows the performance of a corresponding light emitting device using 1-Porphyrin dendrimer between ITO and Ca electrodes.
Figure 8:
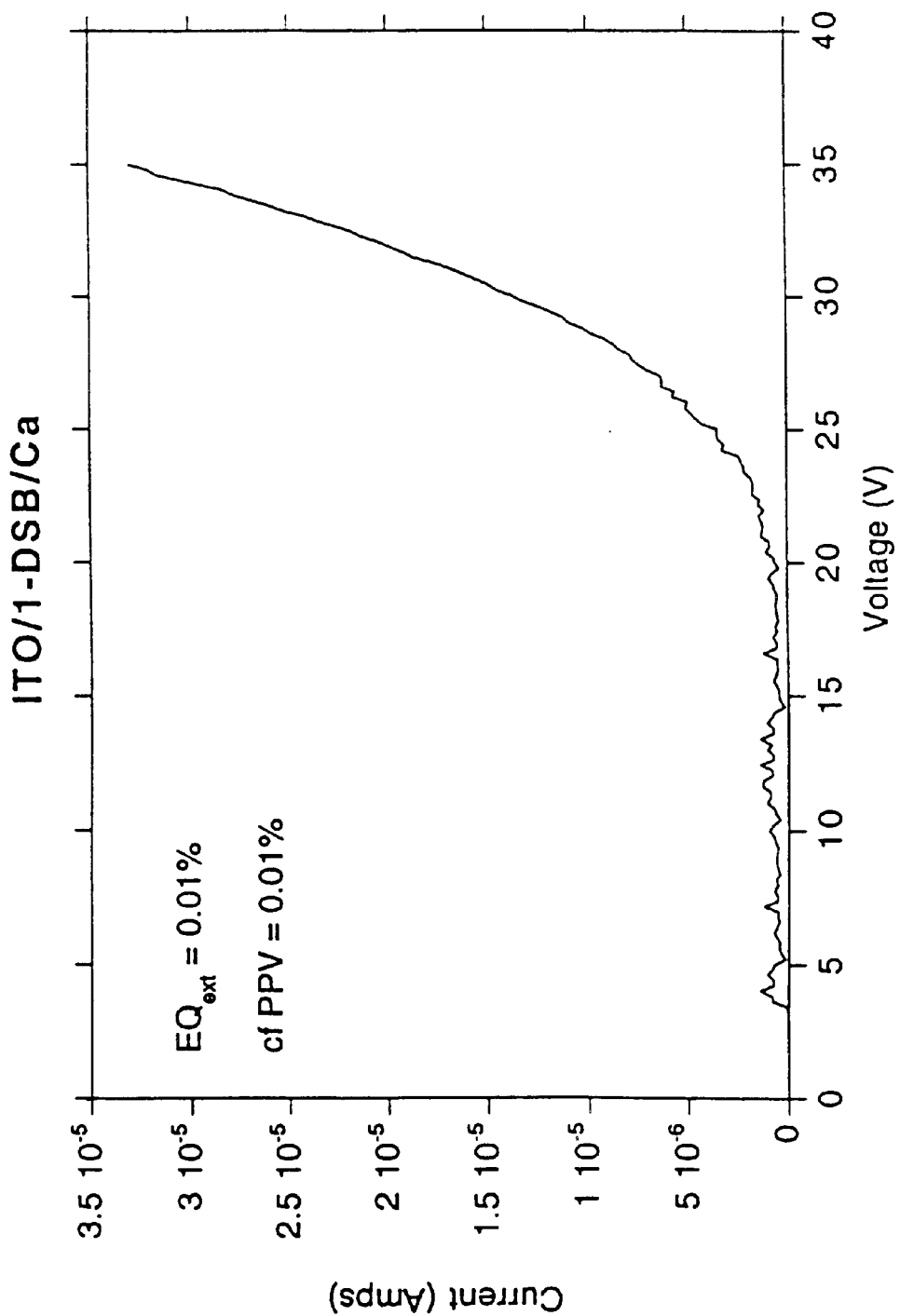
FIG. 8 confirms the diode electrical characteristics of a light emitting device using 1-DSB between ITO and Ca electrodes.

The compound may have more than one luminescent moiety and the energy resulting from electrical or optical excitation is transferred to one of them for light emission. In a preferred embodiment the dendrimer incorporates at least two inherently at-least-partly-conjugated luminescent moieties which moieties may or may not be conjugated with each other, wherein the or each said dendritic structure(s) include(s) at least one of the said luminescent moieties, the luminescent moiety or moieties further from the core of the dendrimer being of larger HOMO-LUMO energy gap than the luminescent moiety or moieties closer to or partly or wholly within the core of the dendrimer. In another embodiment the HOMO-LUMO energy gap is the same.

The relative HOMO-LUMO energy gaps of the moieties can be measured by methods known per se using a UV-visible spectrophotometer. It appears that this graduation of HOMO-LUMO energy gap being lower in those luminescent moieties which are closer to the core is beneficial in encouraging inwards charge transfer and increased light-emitting activity within the dendrimer molecules, possibly by reducing migration of the excited states to quenching sites and giving rise to the possibility of charge build-up. One of the luminescent moieties may be, or (partly or wholly) within, the core itself, which will thus preferably have a smaller inherent HOMO-LUMO gap energy than the other luminescent moiety or moieties in the dendritic structures. Alternatively, or in addition, the dendritic structures themselves may each contain more than one luminescent moiety, in which case those further form the core will again preferably have larger inherent HOMO-LUMO gap energies than those closer to the core. In this case, the core itself need not be luminescent, although luminescent cores are generally preferred.

Other aspects of the invention provide a light-emitting device incorporating as or in its light-emitting element a compound having the formula:

in which CORE represents an atom or group, n represents an integer of at least 1 and DENDRITE, which may be the same or different if n is greater than 1, represents an inherently at least partly conjugated dendritic molecular structure comprising aryl and/or heteroaryl groups and alkenyl groups connected to each other via a carbon atom of an alkenyl group to a ring carbon atom of an aryl or heteroaryl group, CORE terminating in the first single bond which is connected to a ring carbon atom of an (hetero)aryl group to which more than one at least partly conjugated dendritic chain is attached, said ring carbon atom forming part of DENDRITE, the CORE and/or DENDRITE being luminescent.

Advantages of Dendrimers for Light Emitting Devices

Selection of Emission Colour: We envisage that at-least-partially alkylene conjugated units of specific length and substitution can be introduced as the core or branches of dendrimers to give good colour selection possibilities for light emitting devices. For example, dendrimers which have units derived from trans,trans-distyryl benzene as the core and branches should have the good photoluminescence quantum efficiency and blue emission of the parent compound (Nakatsuji et al, J. Chem. Soc. Perkin Trans 2, 1991, 861).

Control of Intermolecular Interactions and Avoidance of Concentration Quenching: Intermolecular interactions have a strong effect on the photophysics of conjugated molecules, and the flexibility of synthesis (generation number, surface groups, linkers, etc.) will allow them to be controlled. This is believed to be a particular advantage for the efficiency of blue emission, because it will tend to prevent the blue luminescence from being quenched by excimer formation, which may render the emission yellow instead. In addition, there are a wide range of luminescent molecules, for example, dyes. Luminescence in these systems is often quenched at high concentrations, as encountered in the film. By incorporating these molecules into a dendrimer we can avoid this, for example, by avoiding processes such as pi-stacking. Hence dendrimers provide a way of using an enormous range of chromophores that could not otherwise be easily used, for example, porphyrins.

Simultaneous Optimisation of Efficiency and Processing: With higher-generation dendrimers (see hereinafter), the surface groups may tend to assume a majority or substantially all of the molecular contact with the surrounding environment. Therefore, the outer surface controls the solubility and processability of the molecule and thus changes to the internal electronic structure of the chromophore(s) should be possible without unacceptably affecting the processing properties and vice versa. In contrast, the solubility and processibility of linear conjugated polymers can be dramatically affected by the attachment of substituents, e.g., electron-withdrawing groups which facilitate electron injection. Therefore, the dendrimers described here provide an opportunity of optimising the electronic and processing properties independently which should give improved manufacturablilty of electronically optimised materials. Some examples of the surface groups which would be suitable to incorporate onto the dendrimers include branched and unbranched alkyl, especially t-butyl, branched and unbranched alkoxy, hydroxy, alkylsilane, carboxy, carbalkoxy, and vinyl. A more comprehensive list include a further-reactable alkene, (meth)acrylate, sulphur-containing, or silicon-containing group; sulphonyl group; polyether group; $C_1$-to-$C_{15}$ alkyl (preferably t-butyl) group; amine group; mono-, di- or tri- $C_1$-to-$C_{15}$ alkyl amine group; —COOR group wherein R is hydrogen or $C_1$-to-$C_{15}$ alkyl; —OR group wherein R is hydrogen, aryl, or $C_1$-to-$C_{15}$ alkyl or alkenyl; —$O_2$SR group wherein R is $C_1$-to-$C_{15}$ alkyl or alkenyl; —SR group wherein R is aryl, or $C_1$-to-$C_{15}$ alkyl or alkenyl; —$SiR_3$ groups wherein the R groups are the same or different and are hydrogen, $C_1$-to-$C_{15}$ alkyl or alkenyl, or —SR' group (R' is aryl or $C_1$-to-$C_{15}$ alkyl or alkenyl), aryl, or heteroaryl.

Efficiency of Light Emission: It is considered, according to the present invention, that the efficiency of light emission from light emitting devices based on dendrimers tends to be better than that of light emitting devices based on linear polymers. This is because exciton migration to quenching sites can be inhibited, optimised chromophores can be used, and intermolecular interactions controlled to avoid undesirable processes such as excimer formation. In linear conjugated polymers the exciton migrates through the sample to regions of low HOMO-LUMO gap energy and can often encounter defects which quench the luminescence. Dendrimers can be designed according to the present invention so that the innermost or central chromophores have a lower HOMO-LUMO energy gap than chromophores closer to the surface. Thus, once an excited state moves towards the core it can be trapped within the dendrimer and further migration to quenching sites impeded. In addition, this process will tend to give rise to a space charge build-up similar to that obtained in organic light emitting devices incorporating a hole-blocking electron transporting layer. Dendrimers with electron-withdrawing groups attached to the chromophores and/or high electron affinity chromophores will be easier to prepare as the routes involve "small molecule" reactions, which do not have the same stringent requirements, for example, yield, of those for forming high polymers.

Device Lifetime: Dendrimers tend to show improved chemical stability for two reasons. First, as the excited state can be located at the core of the molecule, it is more protected from the environment, and it is likely to give improved photochemical stability. Second, dendrimers generally have much higher glass transition temperatures than the chromophores they contain, generally giving improved thermal stability to the device and reducing problems of recrystallisation associated with smaller molecules.

Synthesis

The types of dendrimer contemplated for the present purposes incorporate conjugated units which are preferably based on arylenes and heteroarylenes linked by alkenyl (preferably vinyl) groups. The conjugation of the core may be varied both in length, with the aim to have the HOMO-LUMO energy gap lower than that of the branches as aforesaid, and in substituent pattern. This allows control of the colour of emission, from blue to red, and of electron affinity. Surface groups may be chosen to afford solubility and processibility to the dendrimers in common solvents. If the need arises for multilayer LEDs to be prepared, then the surface groups may be selected to allow crosslinking.

The core compound will often be a monomeric compound, but complex molecules, for example porphyrins, and dimers, trimers, and oligomers are not excluded. Specific examples include a moiety of benzene, pyridine, pyrimidine, triazine, thiophene, divinylbenzene, distyrylethylene, divinylpyridine, pyrimidine, triazine, divinylthiophene, oxadiazole, coronene, or a triarylamine or a fluorescent dye or marker compound, or a polyphenylene chain and especially a distyryl anthracene, porphyrin or distyrylbenzene moiety. These various rings may be substituted, for example by $C_1$ to $C_{15}$ alkyl or alkoxy groups. In one embodiment there are no halogen substituents.

It is likely to be preferred to include in the dendrimers groups that favour electron and hole transport into the dendrimers, thus providing in a single molecule the electron and hole transporting agents which are provided as distinct layers in previously known devices, for example of structure ITO/hole tranport layer/emissive layer/electron transport layer/metal contact. A "one-sided" dendrimer from a core having a single reactive site, or preferably dendrimers built around a core with two, three, or more reactive sites, could be useable. Very large cores, e.g. a porphyrin or a multi-ring system with more than six reactive sites, can be sterically possible. Oligomeric cores formed of units such as distyrylbenzene, phenylene, phenylene-vinylene, and terphenyl may be useful.

As indicated the DENDRITE part of the molecules are formed of aryl and/or heteroaryl groups and alkenyl groups connected to each other via a carbon atom of an alkenyl group to a ring carbon atom of an aryl or heteroaryl group. DENDRITE is inherently at least partly conjugated; "inherently" means that there is conjugation within DENDRITE itself. The aryl groups are preferably benzene rings, preferably coupled at ring positions 1, 3 and 5, pyridyl or triazinyl rings, or polyphenylene chains. These groups may optionally be substituted, typically by $C_1$ to $C_{15}$ alkyl or alkoxy groups. Thus DENDRITE is typically illustrated by groups coupled by conjugated linkages in 1st, 2nd or 3rd (or higher) generation structures of general formula

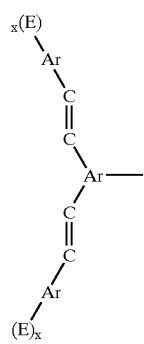

which is the first generation which is denoted by A,

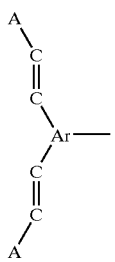

which is the second generation which is denoted by B,

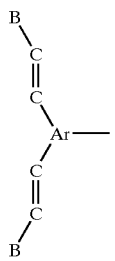

which is of the third generation, in which x is 1, 2, or 3 and E is a surface group which may be the same or different if more than one.

Figure 10:
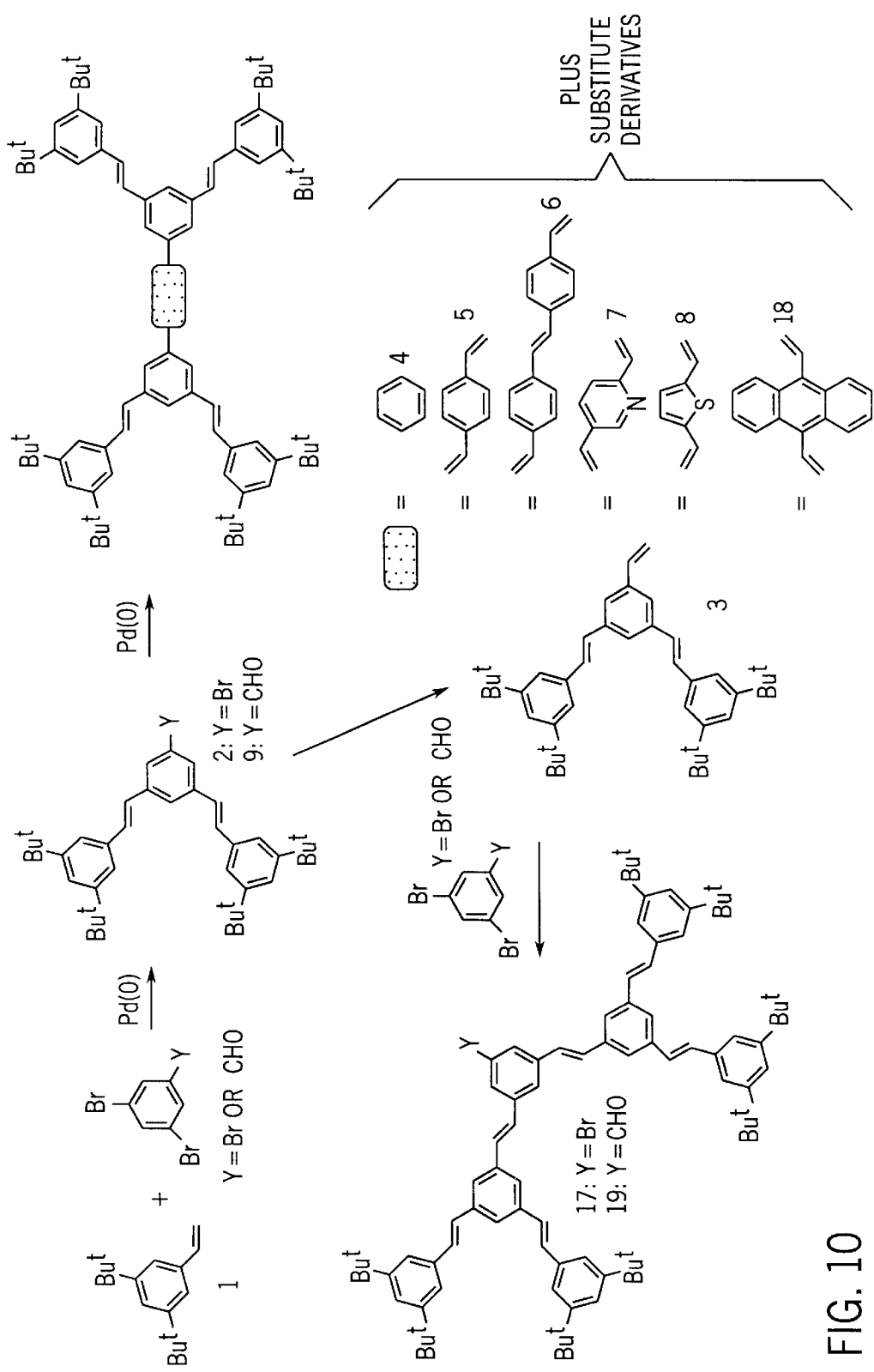
FIG. 10 illustrates dendrimer of the present invention.
Figure 11:
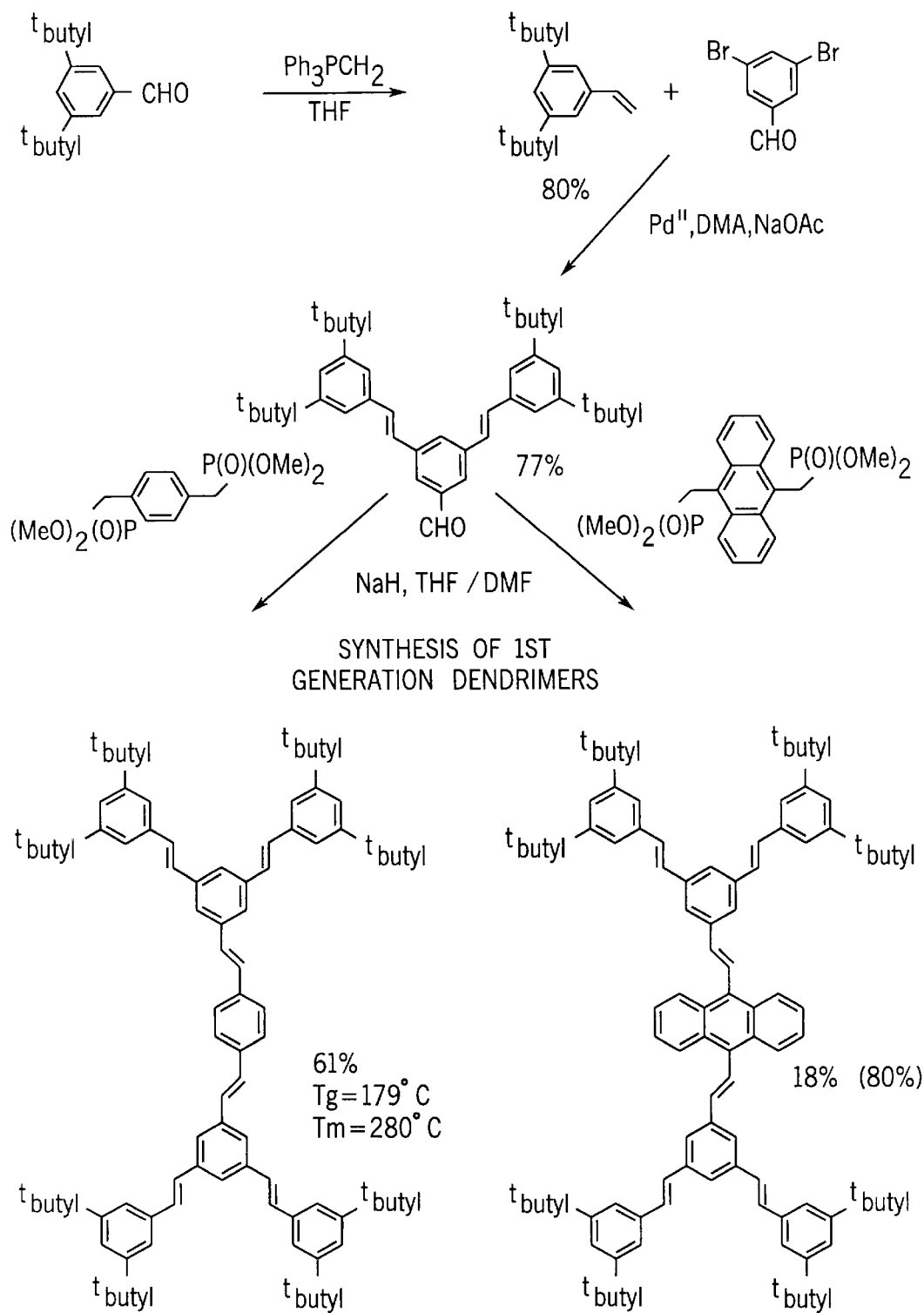
FIGS. 11–16 illustrate specific examples of dendrimers according to the present invention, and of materials and methods for preparing them.
Figure 12:
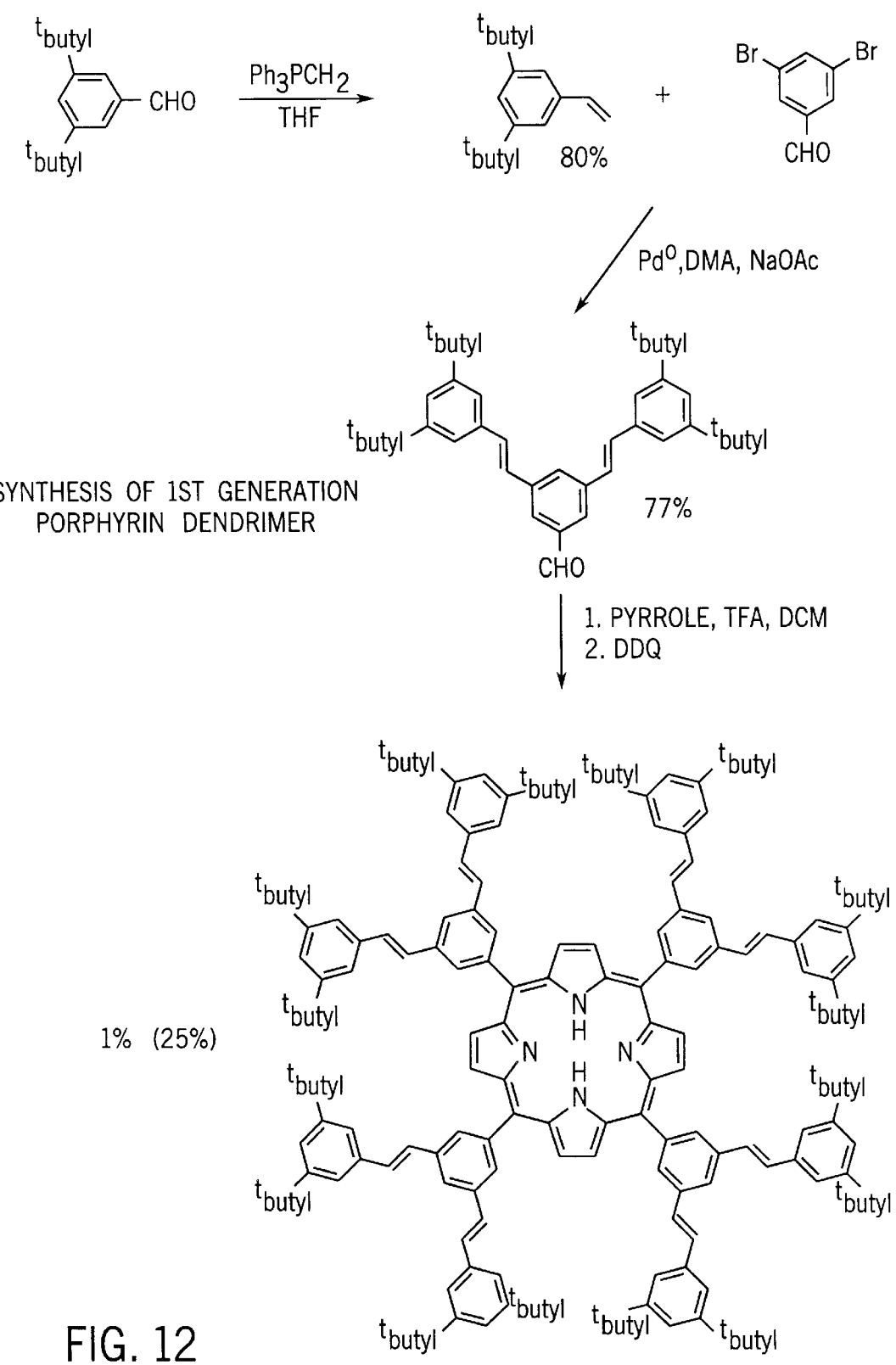
Figure 13:
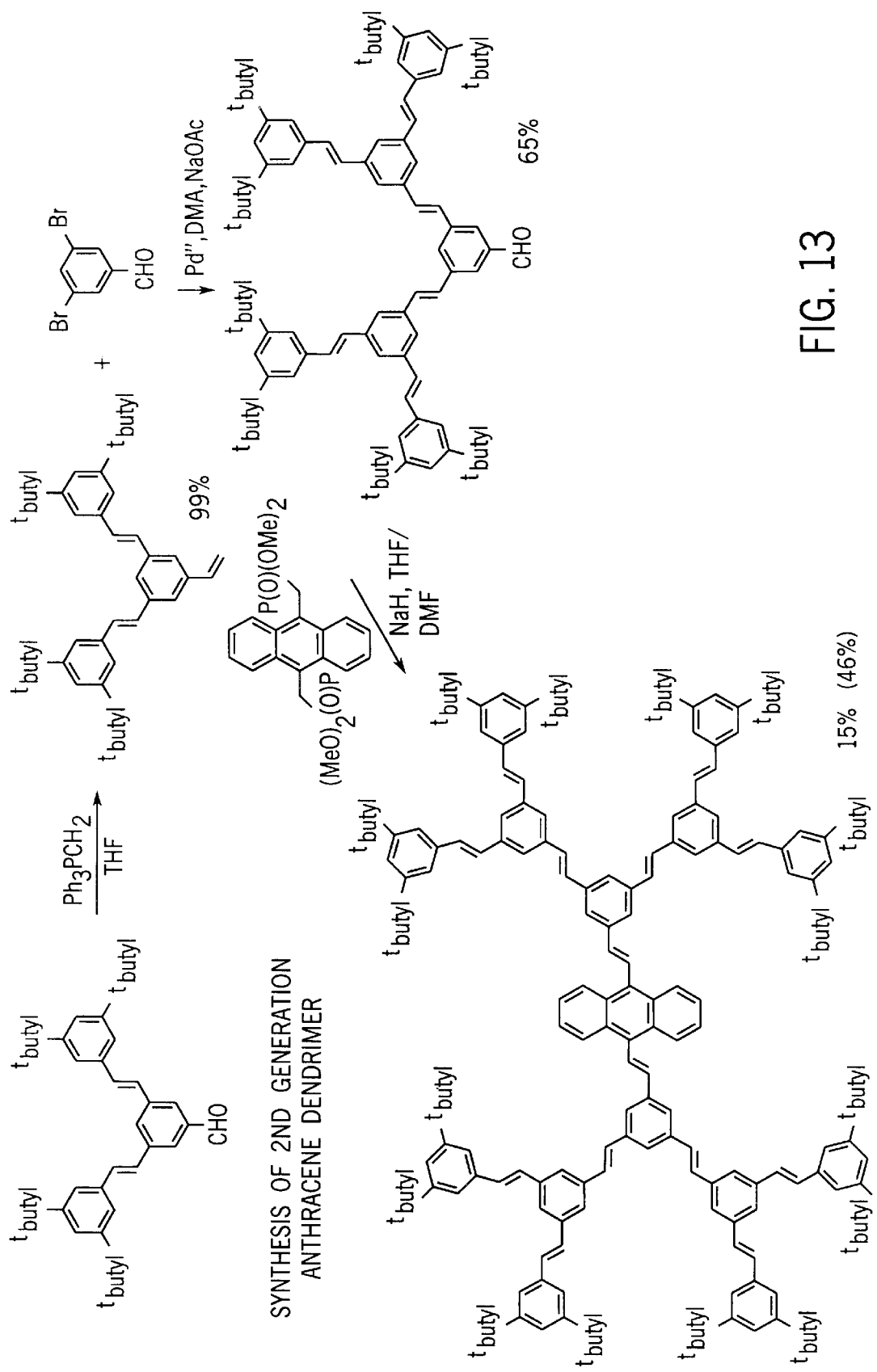
Figure 14:
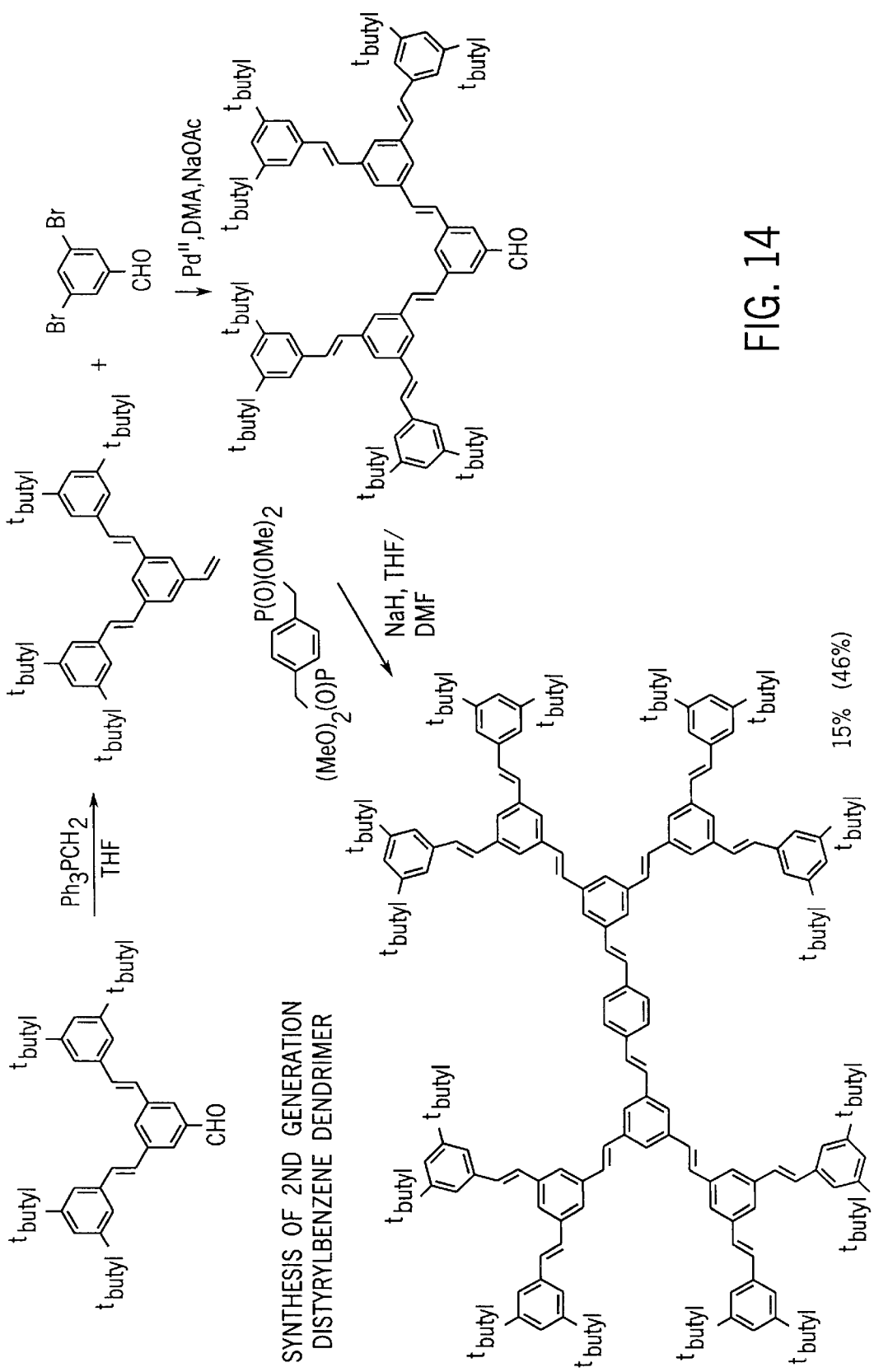
Figure 15:
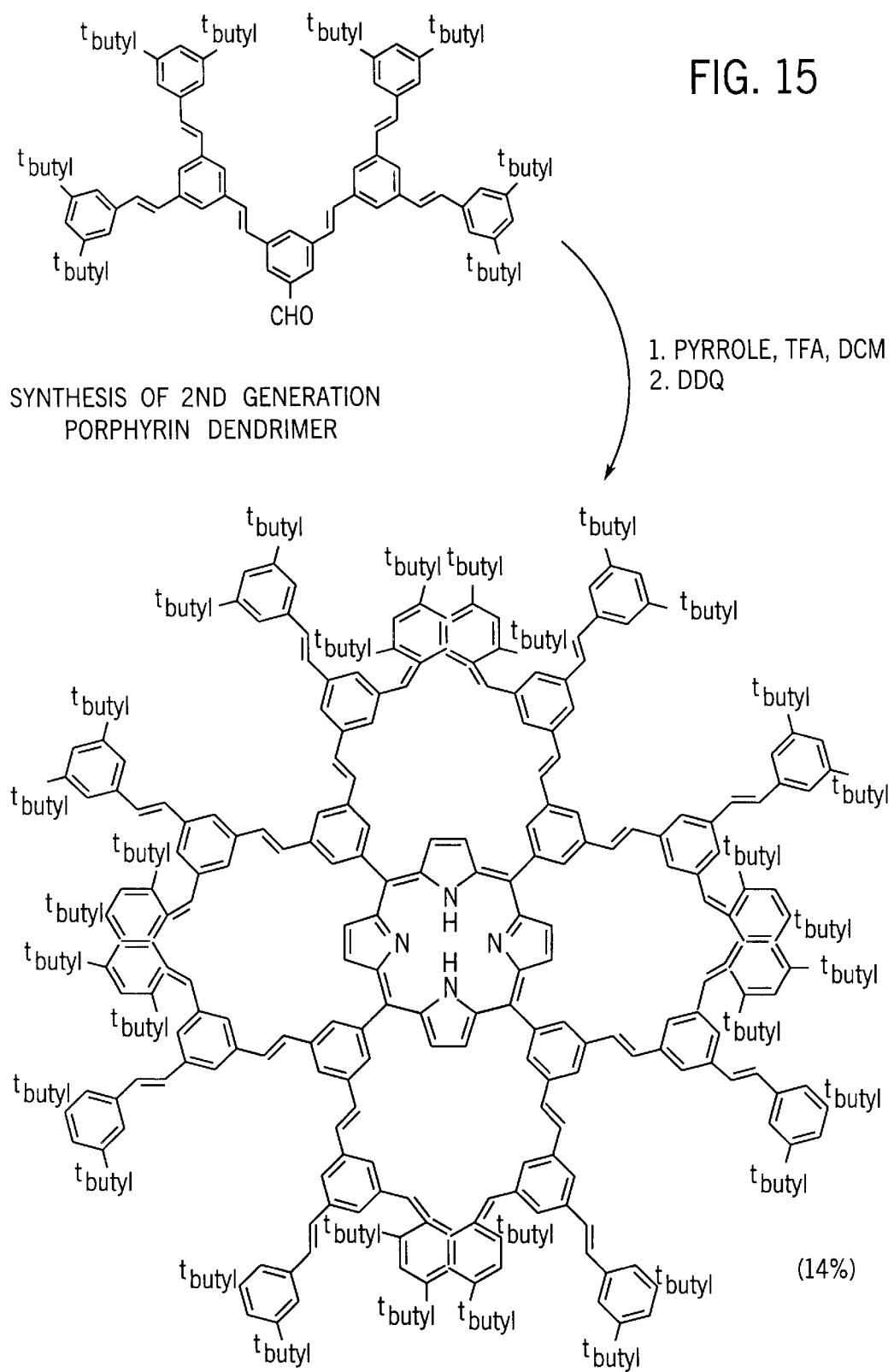
Figure 16:
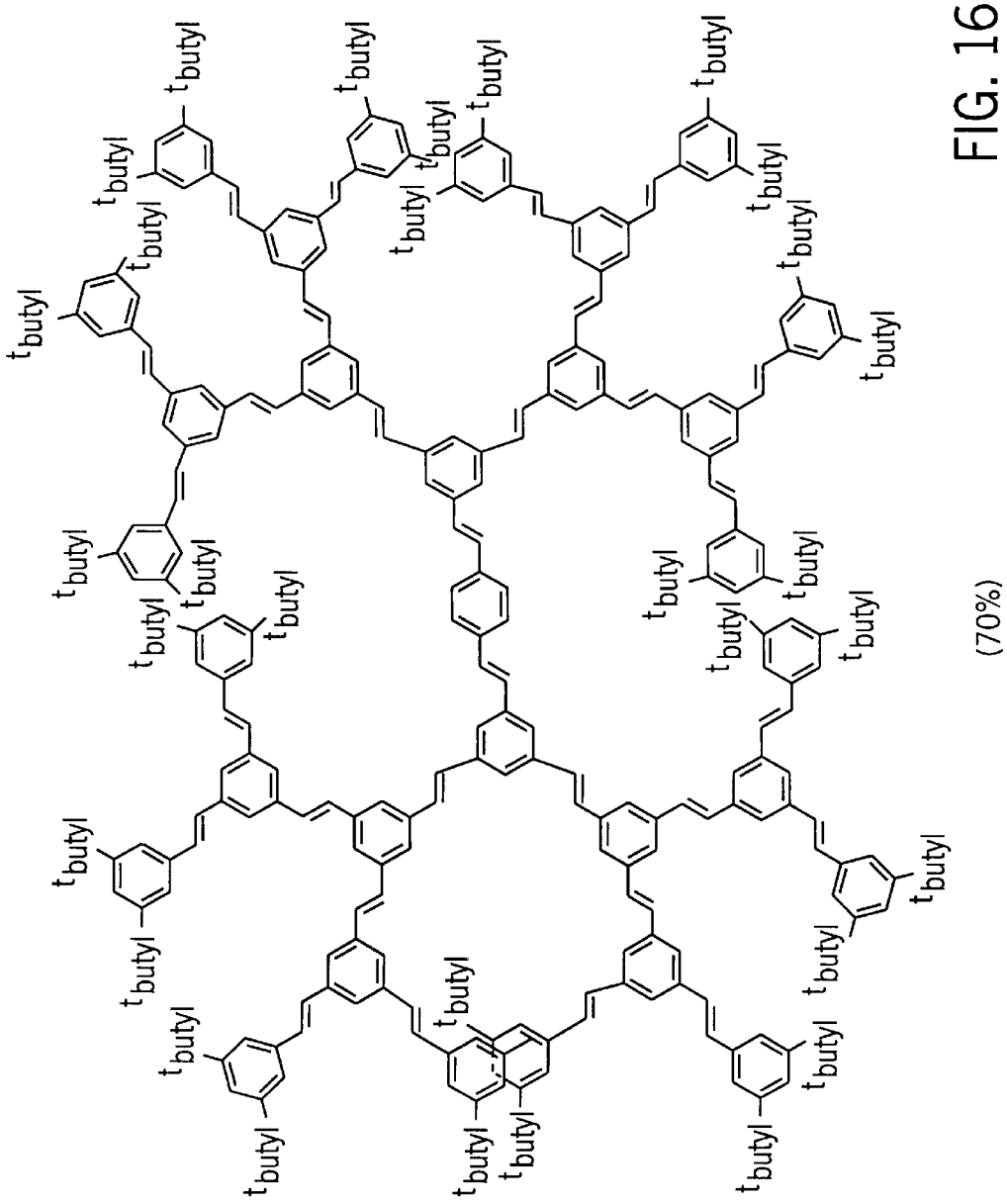

Example of dendrimers according to the invention are illustrated in the accompanying FIG. 10 and have all the chromophores linked by conjugated units and in particular alkylene moieties.

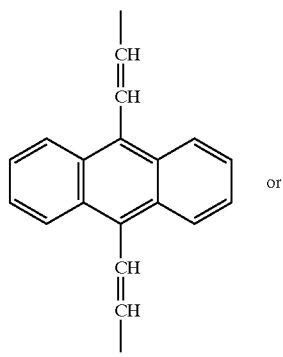

or

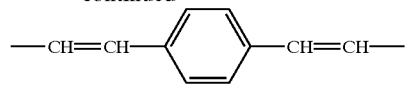

It will be appreciated that CORE can comprise at least two aromatic rings which are not fused to one another as unit 6.

This type of dendrimer may appear fully conjugated. However, as the branch linkages are all meta in arrangement, the pi-electron system is not fully delocalised over the whole molecule (R. S. Kang et al, J. Chem. Soc., Chem. Comm., 1996, 1167). This means that in a simple analysis the core can be considered independently from the branches when determining the required colour of light emission and the relative energy gaps or conjugation lengths. The core does not necessarily have to be conjugated or aromatic. For example, the core could be a nitrogen or carbon atom to which aryl ring units of three or four dendritic structures could be bonded.

The synthetic sequence developed for the preparation of 4 and 5 may be extended/repeated to form higher-generation and/or differently-substituted dendrimers (see Diagram 2). Initially, branches comprising stilbene units are preferred whilst varying the conjugation length and electron affinity of the core. Use of t-butyl groups as the surface groups is initially preferred, as they have afforded good films of 4 and 5. The use, as CORE groups, of 1,4-distrylbenzyl, 9,10-distyrylanthracenyl and 5,10,15,20-porphyrin is also preferred. Preferably, the first step of the iterative synthetic sequence involves the coupling of 1 (N. Risch et al, Z. Naturforsch, 1994, 496, 141) to 1,3,5-tribromobenzene using palladium catalysis (W. A. Hermann et al, Angew. Chem. Int. Ed. Engl., 1995, 34, 1844) to give 2, followed by coupling of the resulting distyrylbromo intermediate 2 with aryl and/or heteroaryl bis-stannanes or bis-vinyls to give first generation dendrimers such as 4, 5, 6, 7, and 8. For example, 4 has been formed by coupling 2 with 1,4-bis-tri-n-butylstannylbenzene and 5 from the coupling of 2 with 1,4-divinylbenzene. In each case the first generation dendrimers will have a different HOMO-LUMO energy gap, giving rise to different emission colours, as well as different electron affinities. The links per se shown in Diagram 2 for the core may be produced by literature procedures. The invention includes increasing the generation number of the dendrimers and to this end 3 has been synthesised, which is a vinyl derivative of the first-generation branching reactant 2. It is further possible to react 3, as in the case of 1, with 1,3,5-tribromobenzene to give the second-generation branch 17, which can then be attached to the cores as before. We envisage that the second-generation branch can then be converted to its vinyl derivative for the next iteration to give subsequent (third and possibly higher) generations. It will be appreciated that, at every step, a brominated core is needed.

In an alternative preferred iterative route for the preparation of this type of dendrimers the styrene 1 is linked to 3,5-dibromobenzaldehyde (L. S. Chen et al, J. Organomet. Chem., 1981, 215, 281) utilising a palladium-catalysed coupling. The aldehyde 9 can then be coupled with the required bis-phosponates to give 5, 6, 7, 8 and 18. In addition, 9 can be condensed with pyrrole to give the corresponding porphyrin dendrimer. The next stage in the iteration to form higher generations is to react the aldehyde 9 with triphenylmethylphosphonium iodide to give 3. The styrene moiety of 3 is then coupled to 3,5-dibromobenzaldehyde to give 19. The aldehyde 19 can then be coupled as before to give the next generation of dendrimers. The next generation aldehyde can be prepared in a similar manner. Accordingly the present invention also provides a process for preparing a compound of the formula:

CORE-[DENDRITE]$_n$ in which CORE represents an atom or group, n represents an integer of at least 1 and DENDRITE, which may be the same or different if n is greater than 1, represents an inherently at least partly conjugated dendritic molecular structure comprising aryl and/or heteroaryl groups and alkenyl groups connected to each other via a carbon atom of an alkenyl group to a ring carbon atom or an aryl or heteroaryl group, CORE terminating in the first single bond which is connected to a ring carbon atom of an (hetero)aryl group to which more than one at least partly conjugated dendritic chain is attached, said ring carbon atom forming part of DENDRITE, the CORE and/or DENDRITE being luminescent, which comprises reacting a 3,5-di(halo, preferably bromo)benzaldehyde with a 3,5-di(surface group, preferably t-butyl)styrene, optionally (i) A process for preparing a compound of the formula:

CORE-[DENDRITE]$_n$ in which CORE represents an atom or group, n represents an integer of at least 1 and DENDRITE, which may be the same or different if n is greater than 1, represents an inherently at least partly conjugated dendritic molecular structure comprising aryl and/or heteroaryl groups and alkenyl groups connected to each other via a carbon atom of an alkenyl group to a ring carbon atom of an aryl or heteroaryl group, CORE terminating in the first single bond which is connected to a ring carbon atom of an (hetero)aryl group to which more than one at least partly conjugated dendritic chain is attached, said ring carbon atom forming part of DENDRITE, the CORE and/or DENDRITE being luminescent, which comprises reacting a 3,5-di(halo) benzaldehyde with a 3,5-di(surface group)styrene, optionally (i) converting the aldehyde group of the benzaldehyde which results from the preceding reaction into a vinyl group and (ii) reacting the vinyl compound with 3,5-di(halo)benzaldehyde, said combination of steps (i) and (ii) being carried out one or more times, and finally reacting the benzaldehyde which results from the preceding reaction with a moiety which comprises at least the central part of CORE. It will be appreciated that in the final step anything which will react with aldehyde groups can be used. Typical moieties include pyrrole and phosphonates.

It is furthermore possible to control the electron affinity of the dendrimers by the addition to the chromophores of electron-withdrawing groups, for example cyano and sulfone which are strongly electron-withdrawing and optically transparent in the spectral region we are interested in. Addition of these substituents may be more easily achieved with the preferred arylenevinylene and heteroarylenevinylene cores and at least two different ways of attaching these groups are possible. The first involves the attachment of the electron-withdrawing groups onto the arylene part of the core followed by coupling with 2, 3, and 17. For example, 4-bromomethlythioanisole can be converted in two steps to 1,4-dimethylthiobenzene. Di-bromination may then afford primarily 2,5-dibromo-1,4-dimethylthiobenzene, which when coupled with 3 will give a substituted 5. The methylthio groups may then be oxidised with Oxone or other suitable reagent to give the corresponding sulfones, that is, 5 with two electron withdrawing groups attached to the core. The alternative route will allow the electron-withdrawing groups to be attached to the vinylene units or both parts of the core. This will involve the lithiation of 2 followed by reaction with N,N-dimethylformamide to give 9, which will then be condensed with a variety of bis-acetonitrile arylenes under Knoevegal conditions to give the corresponding alkenes with cyano groups attached. For example, reaction of 9 with the commercially available 1,4-phenylenediacetonitrile will give the dicyano substituted 5. Alternatively the branches and/or core may contain heteroaromatic units such as pyridine, pyrimidine, thiazole, triazine or fluorinated aryl or heteroaryl units to increase the electron affinity of the dendrimer.

Initially, single-dendrimer-layer light emitting devices may be made typically by spin-coating from solution onto, say, indium/tin oxide—(ITO) coated glass substrates followed by the evaporation of a suitable metal cathode such as Al, Mg/Ag or Ca. Devices may then be characterised by measuring their I–V curves, light output, emission spectra, and efficiency. Light emitting devices may be made as follows. Take an ITO-coated glass substrate and deposit a film of the dendrimer by spin-coating (although there are a number of related techniques which could be used). This gives a film of thickness typically 80–150 nm. A top metal contact is then evaporated. The metal injects electrons, the ITO injects holes, and the light comes out of the dendrimer layer when the two meet up, providing they form a singlet exciton. Electroluminescence (EL) efficiency can be expressed as the number of photons emitted by the device divided by the number of electrons passing through it. This is known as the external quantum efficiency. There is also a quantity known as the internal quantum efficiency, which is the number of photons generated in the device divided by the number of electrons passing through it. This number is a factor 5–8 higher than the external quantum efficiency because only some of the photons get out of the device.

The following Examples further illustrate the present invention:

Synthesis

3,5-Di-t-butylstyrene

Dry tetrahydrofuran (80 ml) was added to a mixture of potassium t-butoxide (6.740 g, 60.06 mmoles) and methyltriphenylphosphonium bromide (24.276 g, 60.06 mmoles) and stirred at room temperature for 30 minutes. A solution of 3,5-di-t-butylbenzaldehyde (10.087 g, 46.20 mmoles) in dry tetrahydrofuran (30 ml) was then added and the reaction mixture was stirred at room temperature for 17 hours. Acetone (50 ml) was then added and then all of the solvent was removed under vacuum. Pet. ether (60–80, 150 ml) was then added to the residue and the mixture was stirred vigorously for 30 minutes. The solution was then filtered through silica, rinsing thoroughly with pet. ether (60–80) and the solvent removed under vacuum to give 3,5-di-t-butylstyrene (9.302 g, 93%).

3,5-bis(3',5'-di-t-butylstyryl)styrene

FIRST EXAMPLE

Dry tetrahydrofuran (300 ml) was added to a mixture of methyltriphenylphosphonium iodide (17.00 g, 42.0 mmoles) and potassium t-butoxide (4.72 g, 42.0 mmoles) and stirred at room temperature for 10 minutes. 3,5-bis(3',5'-di-t-butylstyryl)benzaldehyde (17.00 g, 42.0 mmoles) was then added and the reaction mixture was stirred at room temperature for 75 minutes. The solvent was then evaporated and the remaining sludge was triturated with dichloromethane-pet.ether (40–60) (1:9) and filtered through silica, rinsing thoroughly with the same solvent mixture. The solvent was evaporated to give 3,5-bis(3',5'-di-t-butylstyryl)styrene (14.83 g, 99%), mp 150° C. (Found: C, 90.03; H, 9.98. C40H52 requires C, 90.16; H, 9.84%); $\lambda_{max}$(CHCl3)/nm 318 ($\epsilon$/dm3 mol-1 cm-1 68500); $\delta_H$(500 MHz; CDCl3) 1.39 (36H, s, tBu), 5.34 (1H, d, J 11, 8-H), 5.88 (1H, d, J 18, 8-H), 6.79 (1H, dd, J 11 and 18, 7-H), 7.15 (2H, d, J 16, 7'-H), 7.25 (2H, d, J 16, 8'-H), 7.38 (2H, t, J 1.75, 1'-H), 7.42 (4H, d, J 1.75, 3', 5'-H), 7.49 (2H, d, J 1.3, 3,5-H), 7.63 (1H, m, 1-H).

SECOND EXAMPLE

Dry tetrahydrofuran (375 mL) was added to a mixture of methyltriphenylphosphonium iodide (50.6 g, 125 mmoles) and potassium t-butoxide (14.0 g, 125 mmoles) and stirred at room temperature for 15 minutes. 3,5-bis(3',5'-di-t-butylstyryl)benzaldehyde (44.6 g, 83.4 mmoles) was then added and the reaction mixture was stirred at room temperature for 90 minutes. The solvent was then evaporated and the remaining sludge was triturated with dichloromethane-pet.ether (40–60) (1:9) and filtered through silica, rinsing thoroughly with the same solvent mixture. The crude product was recrystallised from dichloromethane/methanol to give white crystals of 3,5-bis(3',5'-di-t-butylstyryl)styrene (42.15 g, 95%) m.p. 143–145° C. with microanalysis i/r, u/v, NMR and mass spectrographic data substantially identical to that of the first example.

3,5-bis[3',5'-bis(3",5"-di-t-butylstyryl)styryl]styrene

FIRST EXAMPLE

Dry tetrahydrofuran (1 ml) was added to a mixture of methyltriphenylphosphonium iodide (135 mg, 0.334 mmoles) and potassium t-butoxide (37 mg, 0.334 mmoles) and stirred at room temperature for 10 minutes. A solution of 3,5-bis(3',5'-di-t-butylstyryl)benzaldehyde (195 mg, 0.167 mmoles) in dry tetrahydrofuran (1 ml) was then added and the reaction mixture was stirred at room temperature for 1 hour. The solvent was then evaporated and the remaining sludge was triturated with dichloromethane-pet.ether (40–60) (1:4) and filtered through silica, rinsing thoroughly with the same solvent mixture. The solvent was evaporated to give 3,5 bis[3',5'-bis(3,"5"-di-t -butylstyryl)styryl]styrene (181 mg, 93%), $\delta_H$(500 MHz; CDCl3) 1.40 (72H, s, tBu), 5.37 (1H, d, J 11, 8-H), 5.90 (1H, d, J 16, 8-H), 6.82 (1H, dd, J 11 and 16, 7-H), 7.19 (4H, d, J 16, 7"-H), 7.29 (4H, s, 7',8'-H), 7.30 (4H, d, J 16, 8"-H), 7.40 (4H, t, J 1.7, 1"-H), 7.44 (8H, d, J 1.7, 3",5"-H), 7.54 (2H, d, J 1.3, 3,5-H), 7.65 (6H, s, 1',3',5'-H), 7.70 (1H, m, 1-H).

SECOND EXAMPLE

Dry tetrahydrofuran (250 mL) was added to a mixture of methyltriphenylphosphonium iodide (9.87 g, 24.4 mmoles) and potassium t-butoxide (2.74 g, 24.4 mmoles) and stirred at room temperature for 25 minutes. 3,5-bis[3',5'-bis(3",5-"di-t-butylstyryl)styryl]benzaldehyde (19.0 g, 16.3 mmoles) was then added, rinsing with dry tetrahydrofuran (60 mL), and the reaction mixture was stirred at room temperature for 2.3 h. Acetone (50 mL) was then added before all of the solvent was removed under vacuum. The crude product was triturated with dichloromethane-pet.ether (40–60) (1:4) and filtered through silica, rinsing thoroughly with the same solvent mixture. Chromatography on flash silica using dichloromethane-pet.ether (60–80) (3:17) as the eluent was followed by recrystallisation from dichloromethane/methanol to give 3,5-bis[3',5'-bis(3",5"-di-t-butylstyryl)styryl]styrene (18.18 g, 96%), m.p. 272–275° C. (Found: C, 90.2; H, 9.3. $C_{88}H_{108}$ requires C, 90.7; H, 9.3%); $\nu_{max}$ (CHCl3)/cm$^{-1}$ 1594 (C=C) and 965 (C=C—H trans); $\lambda_{max}$ (CHCl3)/nm 313sh (log $\epsilon$/dm$^3$ mol$^{-1}$ cm$^{-1}$ 5.19), 322 (5.23), and 336sh (5.12); $\delta_H$(400 MHz; CDCl3) 1.41 (72H, s, t-Bu), 5.38 (1H, d, J 11, cv H), 5.91 (1H, d, J 18, cv H), 6.82 (1H, dd, J 11 and 18, cv H), 7.19 and 7.31 (8H, d, J 16, G-2 vinyl H), 7.29 (4H, s, G-1 vinyl H), 7.40 (4H, dd, J 2, sp H), 7.45 (8H, d, J 2, sp H), 7.55 (2H, s, cp H), 7.66 (6H, s, G-1 phenyl H), 7.70 (1H, s, cp H); m/z (MALDI) 1165 (M+, 100%).

1-bromo-3,5-bis(3',5'-di-t-butylstyryl)benzene

A mixture of 1,3,5-tribromobenzene (2.910 g, 9.24 mmoles), anhydrous sodium acetate (3.025 g, 37.0 mmoles) and 3,5-di-t-butylstyrene (4.000 g, 18.5 mmoles) was degassed under oil-pump vacuum, purging with argon. A solution of trans-Di(m-acetato)-bis[o-(di-o-tolylphosphino)benzyl]dipalladium (II) (10 mg, 0.01 mmoles) in anhydrous N,N-dimethylacetamide (10 ml) was degassed with argon and then added to the reaction mixture. The reaction mixture was heated in an oil-bath at 130° C. for 16 hours and the temperature was then raised to 140° C. for a further 151 hours. On cooling, ether (100 ml) and distilled water (100 ml) were added. The aqueous layer was separated and extracted with ether (3×30 ml). The combined organic fractions were washed with distilled water (3×30 ml), dried over anhydrous sodium sulphate and evaporated. The crude product (5.329 g) was purified by column chromatography (200 ml, s, pet. ether (60–80)) to give pure 1-bromo-3,5-bis (3',5'-di-t-butylstyryl)benzene (2.012 g, 37%), mp 155 C (Found: C, 78.13; H, 8.60. C38H49Br requires C, 77.93; H, 8.43%); $\lambda_{max}$(CHCl3)/nm 309 ($\epsilon$/dm3 mol-1 cm-1 29300); $\lambda_H$(500 MHz; CDCl3) 1.39 (36H, s, tBu), 7.06 (2H, d, J 16, 7'-H), 7.21 (2H, d, J 16, 8'-H), 7.40 (6H, s, 1',3',5'-H), 7.58 (3H, s, 1,3,5-H); $\delta_C$(125 MHz; CDCl3) 31.46, 34.89, 121.03, 122.57, 123.22, 123.48, 126.39, 127.79, 131.39, 136.03, 139.93, 151.18.

3,5-bis(3',5'-di-t-butylstyryl)benzaldehyde

FIRST EXAMPLE

A mixture of 3,5-dibromobenzaldehyde (10.00 g, 37.89 mmoles), 3,5-di-t-butylstyrene (20.496 g, 94.73 mmoles), anhydrous sodium acetate (12.40 g, 151.56 mmoles), trans-di(m-acetato)-bis[o-(di-o-tolylphosphino)benzyl] dipalladium (II) (72 mg, 0.077 mmoles, 0.1 mole %) and anhydrous N,N-dimethylacetamide (60 ml) was degassed. The reaction mixture was then heated under argon at 130° C. for 21 hours. After cooling, ether (200 ml) and distilled water (150 ml) were added. The aqueous layer was extracted with ether (3×40 ml) and the combined organic extracts were washed with distilled water (5×50 ml) and dried over anhydrous sodium sulphate. The sodium sulphate was extracted with dichloromethane (3×50 ml) and the combined organic fractions were evaporated. The crude product (24.886 g) was triturated thoroughly with pet. ether (60–80, 200 ml) and the solid was filtered and dried under vacuum to give 3,5-bis(3',5'-di-t-butylstyryl)benzaldehyde (15.53 g, 77%). $\delta_H$(500 MHz; CDCl3) 1.39 (36H, s, tBu), 7.19 (2H, d, J 16, 7'-H), 7.33 (2H, d, J 16, 8'-H), 7.41 (2H, t, J 1.7, 1'-H), 7.43 (4H, d, J 1.7, 3',5'-H), 7.93 (1H, m, 1-H), 7.95 (2H, d, J 1.5, 3,5-H), 10.10 (1H, s, CHO).

SECOND EXAMPLE

A mixture of 3,5-dibromobenzaldehyde (31.7 g, 120 mmoles), 3,5-di-t-butylstyrene (65.0 g, 301 mmoles), anhydrous sodium carbonate (31.9 g, 301 mmoles), trans-di($\mu$-acetato)-bis[o-(di-o-tolylphosphino)benzyl]dipalladium (II) (244 mg, 0.26 mmoles, 0.1 mole %), 2,6-di-t-butylcresol (13.3 g, 60 mmoles) and anhydrous N,N-dimethylacetamide (130 mL) was degassed thoroughly whilst stirring under oil-pump vacuum, purging with argon. The reaction mixture was then heated under argon at 130° C. for 26.5 h. After cooling, ether (250 mL) and hydrochloric acid (1.5 M, 150 mL) were added carefully. A suspension remained in the organic layer, which was washed with distilled water (5×125 mL) and evaporated. The combined aqueous layers were extracted with ether (100 mL) and this organic extract was washed with distilled water (4×30 mL) and combined with the main organic fraction. The crude product was triturated thoroughly with cold pet. ether (40–60), filtered and recrystallized from dichloromethane/pet. ether (60–80) to give colourless crystals of 3,5-bis(3',5'-di-t-butylstyryl)benzaldehyde (44.61 g, 69%), m.p. 217–219° C. (Found: C, 87.7; H, 9.7. $C_{39}H_{50}O$ requires C, 87.6; H, 9.4%); $\nu_{max}$ (CHCl$_3$)/cm$^{-1}$ 1698s (C=O), 1596s (C=C) and 964s (C=C—H trans); $\lambda_{max}$ (CHCl$_3$)/nm 316 (log $\epsilon$/dm$^3$ mol$^{-1}$ cm$^{-1}$ 4.65); $\delta_H$(500 MHz; CDCl$_3$) 1.41 (36H, s, t-Bu), 7.20 and 7.34 (4H, d, J 16, vinyl H), 7.43 (2H, dd, J 2, sp H), 7.44 (4H, d, J 2, sp H), 7.94 (1H, m, cp H), 7.95 (2H, d, J 1.5, cp H) and 10.11 (1H, s, CHO); m/z (APCI+) 535 (M+, 100%).

3,5-bis[3',5'-bis(3",5-"di-t-butylstyryl)styryl]benzaldehyde

FIRST EXAMPLE

A mixture of 3,5-bis(3',5'-di-t-butylstyryl)styrene (976 mg, 1.83 mmoles), 3,5-dibromobenzaldehyde (193 mg, 0.732 mmoles), anhydrous sodium acetate (240 mg, 2.93 mmoles), trans-di(m-acetato)-bis[o-(di-o-tolylphosphino)benzyl]dipalladium (II) (20 mg, 0.021 mmoles, 0.1 mole %) and anhydrous N,N-dimethylacetamide (4 ml) was degassed. The reaction mixture was then heated in an oil-bath at 135° C. under argon for 16 hours. The reaction mixture was then poured into a rapidly stirred mixture of water (30 ml) and pet. ether (60–80) (50 ml). The precipitate was filtered and the crude product (518 mg) was recrystallized from dichloromethane/pet. ether (60–80) to give a white powder of 3,5-bis[3',5-'bis(3",5"-di-t-butylstyryl)styryl]benzaldehyde (407 mg, 48%). $\delta_H$(500 MHz; CDCl3) 1.40 (72H, s, tBu), 7.19 (4H, d, J 16, 7"-H), 7.31 (4H, d, J 16, 8"-H), 7.34 (2H, d, J 16, 7'-H), 7.37 (2H, d, J 16, 8'-H), 7.40 (4H, t, J 1.6, 1"-H), 7.45 (8H, d, J 1.6, 3",5"-H), 7.66 (4H, s, 3',5'-H), 7.67 (2H, s, 1'-H), 7.99 (3H, s, 1,3,5-H), 10.13 (1H, s, CHO).

SECOND EXAMPLE

A mixture of 3,5-dibromobenzaldehyde (8.21 g, 31.1 mmoles), 3,5-bis(3',5'-di-t-butylstyryl)styrene (41.4 g, 77.7 mmoles), anhydrous sodium carbonate (6.59 g, 62.2 mmoles), trans-di($\mu$-acetato)-bis[o-(di-o-tolylphosphino)benzyl]dipalladium (II) (58.3 mg, 0.062 mmoles, 0.1 mole %), 2,6-di-t-butylcresol (1.71 g, 7.77 mmoles) and anhydrous N,N-dimethylacetamide (100 mL) was degassed extremely thoroughly whilst stirring under oil-pump vacuum, purging with argon. The reaction mixture was then heated under argon at 130° C. for 17 hours. After further addition of anhydrous N,N-dimethylacetamide (100 mL), the reaction mixture was degassed for a second time and then heated at 130° C. for a further 5.5 hours. Further anhydrous N,N-dimethylacetamide (100 mL) was then added and the reaction was continued for a further 1 hour. The resulting sludge was washed with distilled water (3×250 mL) and dissolved in dichloromethane (1500 mL). The organic fraction was washed with distilled water (500 mL), dried over anhydrous sodium sulphate and evaporated to give a cream solid. The crude product was recrystallized from dichloromethane/pet. ether (60–80) three times before chromatography on flash silica using chloroform-pet.ether (60–80) (2:3) as the eluent gave a white solid of 3,5-bis[3',5'-bis(3",5-"-di-t-butylstyryl)styryl]benzaldehyde (25.2 g, 69%); $\delta_H$(500 MHz; CDCl$_1$) 1.41 (72H, s, t-Bu), 7.20 and 7.32 (8H, d, J 16, G-2 vinyl H), 7.34 and 7.38 (4H, d, J 16.5, G-1 vinyl H), 7.42 (4H, dd, J 2, sp H), 7.46 (8H, d, J 2, sp H), 7.67 (4H, s, G-1 bp H), 7.69 (2H, s, G-1 bp H), 8.00 (3H, s, cp H) and 10.14 (1H, s, CHO) which is identical to that reported.

3,5-bis{3',5'-bis[3",5"-bis(3'",5'"-di-t-butylstyryl)styryl]styryl}benzaldehyde

FIRST EXAMPLE

A mixture of 3,5-bis[3',5'-bis(3",5"-di-t-butylstyryl)styryl]styrene (417 mg, 0.36 mmoles), 3,5-dibromobenzaldehyde (45 mg, 0.17 mmoles), anhydrous sodium acetate (56 mg, 0.681 mmoles), trans-di(m-acetato)-bis[o-(di-o-tolylphosphino)benzyl]dipalladium (II) (16 mg, 0.017 mmoles, 5mole %) and anhydrous N,N-dimethylacetamide (6 ml) was degassed. The reaction mixture was then heated in an oil-bath at 135° C. under argon for 10 hours. After cooling, dichloromethane (15 ml) and distilled water (15 ml) were added. The aqueous layer was extracted with dichloromethane (2×10 ml) and the combined organic fractions were washed with distilled water (2×10 ml), dried over anhydrous sodium sulphate and evaporated to give a brown oil. This crude oil (782 mg) was chromatographed on flash silica using dichloromethane-pet. ether (60–80) (1:3) as the eluent to give a white solid that co-chromatographed with and had identical 1H n.m.r. to 3,5-bis[3',5'-bis(3",5"-di-t-butylstyryl)styryl]styrene (79 mg, 19%). Crude product (304 mg) was also isolated and further chromatographed on flash silica using dichloromethane-pet. ether (60–80) (1:3, increasing to 1:9) as the eluent to give 3,5-bis{3',5'-bis[3",5"-bis(3'",5'"-di-t-butylstyryl)styryl]styryl}benzaldehyde (181 mg, 44%).

SECOND EXAMPLE

A mixture of 3,5-bis[3',5'-bis(3",5"-di-t-butylstyryl)styryl]styrene (4.87 g, 4.18 mmoles), 3,5-dibromobenzaldehyde (441 mg, 1.67 mmoles), anhydrous sodium carbonate (354 mg, 3.34 mmoles), 2,6-di-t-butylcresol (122 mg, 0.554 mmoles), trans-di($\mu$-acetato)-bis[o-(di-o-tolylphosphino)benzyl]dipalladium (II) (3.1 mg, 0.003 mmoles) and anhydrous N,N-dimethylacetamide (30 mL) was degassed very thoroughly under oil-pump vacuum, purging with argon. The reaction mixture was then heated in an oil-bath at 130° C. under argon for 39 hours. After cooling, dichloromethane (200 mL),distilled water (200 mL) and hydrochloric acid (3M, 50 mL) were added. The aqueous layer was extracted with dichloromethane (3×30 mL) and the combined organic fractions were washed with distilled water (3×250 mL), dried over anhydrous sodium sulphate and the solvent removed under vacuum. This crude product (6.35 g) was purified by chromatography on flash silica using dichloromethane-pet. ether (60–80) (1:4) as the eluent followed by recrystallisation from cold dichloromethane/methanol to yield a white solid of 3,5-bis{3',5'-bis[3",5"-bis(3'",5'"-di-t-butylstyryl)styryl]styryl}benzaldehyde (1.04 g, 26%), m.p. 248–253° C.; (Found: C, 89.65; H, 8.8. $C_{183}H_{218}O$ requires C, 90.3; H, 9.0%); $v_{max}$ (CHCl$_3$)/cm$^{-1}$ 1700 (C=O), 1594 (C=C), and 965 (C=C—H trans); $\lambda_{max}$ (CHCl$_3$)/nm 323 (log $\epsilon$/dm$^3$ mol$^{-1}$ cm$^{-1}$ 5.56) and 340sh (5.46); $\delta_H$(500 MHz; CDCl$_3$) 1.39 (144H, s, t-Bu), 7.20 and 7.31 (16H, d, J 16, G-3 vinyl H), 7.31–7.40 (28H, s, G-1 and G-2 vinyl H and sp H), 7.44 (16H, d, J 1.4, sp H), 7.67 (12H, s, G-2 bp H), 7.70 (4H, s, G-1 bp H), 7.76 (2H, s, G-1 bp H), 7.99 (1H, s, cp H), 8.04 (2H, d, J 1, cp H), 10.17 (1H, s, CHO); m/z (MALDI) 2433 ((M+Na)+, 100%).

1,4-phenylenebis(3,5-bis[3,5-di-t-butylstyryl] benzene)

A mixture of distyryl bromide (644 mg, 1.1 mmoles) and phenylene-1,4-bis(tributylstannane) (361 mg, 0.55 mmoles) was degassed and then heated under argon in an oil-bath at 95° C. A solution of trans-di(m-acetato)-bis[o-(di-o-tolylphosphino)benzyl]dipalladium (II) (20 mg, 0.02 mmoles) in anhydrous N,N-dimethylacetamide (10 ml) was added and the reaction mixture was stirred under argon in an oil-bath at 105° C. for 42 hours. Ether (100 ml) and distilled water (100 ml) were then added and the layers separated. The aqueous layer was extracted with ether (3×30 ml) and the combined organic fractions were washed with distilled water (3×30 ml), dried over anhydrous sodium sulphate and evaporated to dryness. The crude product (812 mg) was chromatographed on flash silica using dichloromethane-pet. ether (60–80) (1:19) as the eluent to give pure 1,4-phenylenebis(3,5-bis[3,5-di-t-butylstyryl]benzene) (116 mg, 19%). (Found: C, 90.07; H, 9.55. C82H102 requires C, 90.55; H, 9.45%); $\lambda_{max}$(CHCl3)/nm 315 ($\epsilon$/dm3 mol-1 cm-1 108000); $\delta_H$(500 MHz; CDCl3) 1.40 (72H, s, tBu), 7.23 (4H, d, J 16, 7"-H), 7.32 (4H, d, J 16, 8"-H), 7.40 (4H, t, J 1.7, 1"-H), 7.45 (8H, d, J 1.7, 3",5"-H), 7.73 (4H, s, 3',5'-H), 7.73 (2H, s, 1'-H), 7.81 (4H, s, 2,3,5,6-H).

1,4-bis[3',5'-bis(3",5"-di-t-butylstyryl)styryl]benzene (1-DSB)

FIRST EXAMPLE

A solution of tetramethyl-xylylenebisphosphonate (287 mg, 0.890 mmoles) in dry N,N-dimethylformamide (3 ml) was added to a slurry of sodium hydride (75 mg, 60% in mineral oil, 1.87 mmoles) in dry N,N-dimethylformamide (2 ml) under nitrogen and stirred at room temperature for 1 hour. A suspension of 3,5-bis(3',5'-di-t-butylstyryl) benzaldehyde (1.000 g, 1.87 mmoles) in dry N,N-dimethylformamide (6 ml) was then added and the reaction mixture stirred in the dark under nitrogen at room temperature for 68 hours. After cooling, ether (50 ml) and distilled water (50 ml) were added. The aqueous layer was extracted with ether (4×30 ml) and the combined organic extracts were washed with distilled water (6×100 ml), dried over anhydrous sodium sulphate and evaporated. The crude product (1.147 g) was chromatographed on flash silica using dichloromethane-pet.ether (60–80) (1:9) as the eluent to give 1,4-bis[3',5'-bis(3",5"-di-t-butylstyryl)styryl]benzene (614 mg, 61%), mp 280° C. (Found: C, 89.90; H, 9.33. C86H106 requires C, 90.63; H, 9.37%); $\lambda_{max}$(CHCl3)/nm 325 ($\epsilon$/dm3 mol-1 cm-1 117000), and 367 (75100); $\delta_H$(500 MHz; CDCl3) 1.40 (72H, s, tBu), 7.18 (4H, d, J 16, 7"-H), 7.29 (4H, d, J 16, 8"-H), 7.22 (2H, d, J 16, 7'-H), 7.27 (2H, d, J 16, 8'-H), 7.40 (4H, t, J 1.7, 1"-H), 7.44 (8H, d, J 1.7, Ar 3",5"-H), 7.60 (4H, s, 2,3,5,6-H), 7.62 (4H, m, 3',5'-H), 7.64 (2H, m, 1'-H)

SECOND EXAMPLE

Dry THF (3 ml) was added to a mixture of 3,5-bis(3',5'-di-t-butylstyryl)benzaldehyde (100 mg, 0.187 mmoles), tetramethyl-xylylenebisphosphonate (28.7 mg, 0.089 mmoles) and potassium t-butoxide (25 mg, 0.223 mmoles) under nitrogen and stirred at room temperature in the dark for 16 hours. The solvent was removed under vacuum and ether (30 ml) and distilled water (30 ml) were added. The organic layer was washed with distilled water (3×30 mL), dried over anhydrous sodium sulphate and evaporated. The crude product (107 mg) was isomerised with catalytic iodine in refluxing toluene for 17 hours. The solvent was removed under vacuum and the crude product was purified by chromatography on flash silica using dichloromethane-pet.ether (60–80)-triethylamine (20:180:1) as the eluent to give 1-DSB (58 mg, 57%), m.p. 280° C. with microanalysis i/r, u/v, NMR and mass spectrographic data substantially identical to that of the first example.

1,4-Bis{3',5'-bis[3",5"-bis(3"',5"'-di-t-butylstyryl) styryl]styryl}benzene (2-DSB)

FIRST EXAMPLE

Dry N,N-dimethylformamide (20 ml) was added to a mixture of tetramethyl xylylenebisphosphonate (269 mg, 0.835 mmoles) and sodium hydride (60% in mineral oil, 240 mg, 6.00 mmoles) and stirred under nitrogen until it had formed a dirty yellow solution. A solution of 3,5-bis[3',5'-bis(3",5"-di-t-butylstyryl)styryl]benzaldehyde (2.000 g, 1.71 mmoles) in dry tetrahydrofuran (45 ml) was then added slowly and the reaction mixture was stirred under nitrogen at room temperature for 17 hours. On cooling, ether (100 ml) and distilled water (50 ml) were added. The organic layer was separated, washed with distilled water, dried over anhydrous sodium sulphate and evaporated to dryness. The crude product (6.087 g) was chromatographed on flash silica using dichloromethane-pet. ether (60–80) (3:17) as the eluent. The pure dendrimer fractions were evaporated and, after recrystallisation from dichloromethane-pet. ether (60–80), gave 1,4-bis{3',5'-bis[3",5"-bis(3"',5"'-di-t-butylstyryl)styryl]styryl}benzene (301 mg, 15%). (Found: C, 90.17; H, 9.17. C182H218 requires C, 90.87; H, 9.13%); $\lambda_{max}$ (CHCl3)/nm 323 ($\epsilon$/dm3 mol-1 cm-1 307000) and 367sh (95200); $\delta_H$(500 MHz; CDCl3) 1.41 (144H, s, tBu), 7.20 (8H, d, J 16, 7"'-H), 7.22–7.33 (20H, m, 8"',7",8",7',8'-H), 7.41 (8H, t, J 1.6, 1"'-H), 7.46 (16H, d, J 1.6, 3"',5"'-H), 7.63–7.72 (22H, m, 1",3",5",1',3',5',2,3,5,6-H).

SECOND EXAMPLE

Dry THF (3 ml) was added to a mixture of 3,5-bis[3',5'-bis(3",5"-di-t-butylstyryl)styryl]benzaldehyde (100 mg, 0.086 mmoles), tetramethyl-xylylenebisphosphonate (13.1 mg, 0.041 mmoles) and potassium t-butoxide (11.4 mg, 0.102 mmoles) under nitrogen and stirred at room temperature in the dark for 15 hours. The solvent was removed under vacuum and ether (30 ml), DCM (20 ml) and distilled water (30 ml) were added. The organic layer was washed with distilled water (2×30 mL), dried over anhydrous sodium sulphate and evaporated. The crude product was isomerised with catalytic iodine in refluxing toluene for 17 hours. The solvent was removed under vacuum and the crude product was purified by chromatography on flash silica using dichloromethane-pet.ether (60–80)-triethylamine (20:80:1) as the eluent to give 2-DSB (58 mg, 59%), m.p. 314° C.; (Found: C, 90.2; H, 9.2. C$_{182}$H$_{218}$ requires C, 90.9; H, 9.1%); $v_{max}$(CHCl$_3$)/cm$^{-1}$ 1593 (C=C) and 965 (C=C—H trans); $\lambda_{max}$ (CHCl$_3$)/nm 323 (log $\epsilon$/dm$^3$ mol$^{-1}$ cm$^{-1}$ 5.49), 336sh (5.43), 370sh (4.97), and 392sh (4.70); $\delta_H$(500 MHz; CD$_2$Cl$_2$) 1.40 (144H, s, t-Bu), 7.24 and 7.34 (16H, d, J 16, G-2 vinyl H), 7.31 and 7.36 (4H, d, J 16, core vinyl H), 7.38

(8H, s, G-1 vinyl H), 7.41 (8H, dd, J 2, sp H), 7.47 (16H, d, J 1.6, sp H), 7.68 (2H, s, cp H), 7.70 (12H, s, G-1 phenyl H), and 7.73–7.75 (6H, branch cp H); m/z (MALDI) 2405 (M+, 100%).

1,4-bis(3',5'-bis{3",5"-bis[3"',5"'-bis(3"",5""-di-t-butylstyryl)styryl]styryl}styryl) benzene (3-DSB)

FIRST EXAMPLE

Dry N,N-dimethylformamide (1.5 ml) was added to a mixture of tetramethyl-xylylenebisphosphonate (67 mg, 0.21 mmoles) and sodium hydride (60% in mineral oil, 21 mg, 0.52 mmoles) under nitrogen and stirred under nitrogen for 25 minutes. A 3,5-bis{3',5'-bis[3",5"-bis(3"',5"'-di-t-butylstyryl)styryl]styryl}benzaldehyde (1.000 g, 0.415 mmoles) solution in dry N,N-dimethylformamide (7 ml) was then added slowly and the reaction mixture was stirred under nitrogen at room temperature in the dark for 18 hours. On cooling, ether (20 ml) and distilled water (20 ml) were added. The aqueous layer was extracted with ether (3×10 ml) and the combined organic fractions were washed with distilled water (5×20 ml), dried over anhydrous sodium sulphate and evaporated to dryness. The crude product (979 mg) was chromatographed on flash silica using dichloromethane-pet. ether (60–80) (1:4) as the eluent to give crude 1,4-bis(3',5'-bis{3",5"-bis[3"',5"'-bis(3"",5""-di-t-butylstyryl)styryl]styryl}styryl)benzene (714 mg, 70%)

SECOND EXAMPLE

Dry THF (7 mL) was added to a mixture of 3,5-bis{3',5'-bis[3",5"-bis(3"',5"'-di-t-butylstyryl)styryl]styryl}benzaldehyde (239 mg, 0.099 mmoles), tetramethyl-xylylenebisphosphonate (15.2 mg, 0.047 mmoles) and potassium t-butoxide (22.3 mg, 0.198 mmoles) under nitrogen and stirred at room temperature in the dark for 16 hours. The solvent was removed under vacuum and ether (20 ml) and distilled water (15 ml) were added. The organic layer was washed with distilled water (2×15 mL), dried over anhydrous sodium sulphate and evaporated. The crude product (256 mg) was purified by chromatography on flash silica using dichloromethane-pet.ether (60–80)-triethylamine (30:70:1) as the eluent to give impure [G-3]$_2$DSB. This was isomerised with catalytic iodine in refluxing toluene for 16 hours. The solvent was removed under vacuum and the crude product was purified by chromatography on flash silica using dichloromethane-pet.ether (60–80)-triethylamine (20:80:1) as the eluent to give [G-3]$_2$DSB 11 (129 mg, 55%); (Found: C, 90.7; H, 9.4. C$_{374}$H$_{442}$ requires C, 91.0; H, 9.0%); $v_{max\ (CHCl_3)}$/cm$^{-1}$ 1594 (C=C) and 965 (C=C—H trans); $\lambda_{max}$ (CHCl$_3$)/nm 323 (log $\epsilon$/dm$^3$ mol$^{-1}$ cm$^{-1}$ 5.88), 336sh (5.43), 370sh (4.97), and 392sh (4.70); $\delta_H$(500 MHz; CD$_2$Cl$_2$) 1.37 (288H, s, t-Bu), 7.22 and 7.33 (32H, d, J 16, G-3 vinyl H), 7.25 and 7.40 (4H, core vinyl H), 7.38 (16H, dd, sp H), 7.40 (16H, s, G-2 vinyl H), 7.42 (8H, s G-1 vinyl H), 7.45 (32H, d, J 1.5, sp H), 7.70 (28H, s, cp H and G-2 phenyl H), 7.77 and 7.79 (18H, s, G-1 phenyl H and branch cp H).

5,10,15,20-tetrakis[3',5'-bis(3",5"-di-t-butylstyryl)phenyl]porphyrin (1-Porphyrin)

FIRST EXAMPLE

Dry dichloromethane (850 ml) was distilled into a flask containing pyrrole (550 ml, 8.4 mmoles) and 3,5-bis(3',5'-di-t-butylstyryl)benzaldehyde (4.500 g, 8.414 mmoles) under nitrogen. Trifluoroacetic acid (650 ml, 8.4 mmoles) was then added and the reaction mixture stirred in the dark under nitrogen for 65 hours. DDQ (1.433 g, 6.31 mmoles) was then added and the reaction mixture stirred for a further 50 minutes. The solvent was then removed and the remaining solid was chromatographed on flash silica using triethylamine-dichloromethane-pet. ether (40–60) (1:2:17) as eluent. The leading fluorescent fraction was evaporated, recrystallized from dichloromethane-methanol and dried under vacuum to give purple crystals of crude 5,10,15,20-tetrakis[3',5'-bis(3",5"-di-t-butylstyryl)phenyl]porphyrin (987 mg, 20%). $\lambda_{max}$(film)/nm 305, 433, 521, 556, 598; $\delta_H$(500 MHz; CDCl3) -2.61 (2H, s, NH), 1.35 (144H, s, tBu), 7.3–7.5 (40H, m, 1",3",5",7",8"-H), 8.14 (4H, m, 1'-H), 8.33 (8H, d, J 1.4, 3',5'-H), 9.06 (8H, s, C-2+C-3).

SECOND EXAMPLE

A solution of 3,5-bis(3',5'-di-t-butylstyryl)benzaldehyde (100 mg, 0.19 mmoles), distilled pyrrole (13 μl, 0.19 mmoles) and trifluoroacetic acid (14.5 μl, 0.19 mmoles) in dry dichloromethane (14 mL) under nitrogen was stirred in the dark for 66 hours. 2,3-Dichloro-5,6-dicyano-1,4-quinone (146 mg, 0.64 mmoles) was added and the reaction mixture was stirred for a further 40 minutes. Sodium hydrogencarbonate (1.0 g, 11.9 mmoles) was added and the solvent was removed under vacuum. The crude product was chromatographed on flash silica using dichloromethane-pet. ether (40–60) (3:17) as the eluent. The solvent was removed to give a dark solid of 1-porphyrin (36 mg, 33%), m.p. decomp. 300° C. (Found: C, 88.2; H, 8.9; N, 2.0. C$_{172}$H$_{206}$N$_4$ requires C, 88.7; H, 8.9; N, 2.4%); $v_{max}$ (CHCl$_3$)/cm$^{-1}$ 3322 (NH), 1593 (C=C) and 964 (C=C—H trans); $\lambda_{max}$ (CHCl$_3$)/nm 311 ($\epsilon$/dm$^3$ mol$^{-1}$ cm$^{-1}$ 5.40), 412sh (4.98), 431 (5.82), 520 (4.46), 555 (3.95), 592 (3.82), 648 (3.63); $\delta_H$(500 MHz; CDCl$_3$) -2.61 (2H, s, NH), 1.35 (144H, s, t-Bu), 7.37 (8H, bdd, sp H), 7.41 (8H, d J 16, vinyl H), 7.44–7.47 (24H, vinyl and sp H), 8.15 (4H, bs, branch cp H), 8.34 (8H, d, J 1.2, branch cp H), 9.06 (8H, s, pyrrolic H); m/z (MALDI) 2330 (M+, 100%).

5,10,15,20-tetrakis{3',5'-bis[3",5"-bis(3"',5"'-di-t-butylstyryl)styryl]phenyl}porphyrin (2-Porphyrin)

FIRST EXAMPLE

Dry dichloromethane (350 ml) was distilled into a flask containing pyrrole (240 ml, 3.4 mmoles) and 3,5-bis[3',5'-bis(3",5"-di-t-butylstyryl)styryl]benzaldehyde (4.000 g, 3.4 mmoles) under nitrogen. Trifluoroacetic acid (265 ml, 3.4 mmoles) was then added and the reaction mixture stirred in the dark under nitrogen for 65 hours. DDQ (583 mg, 2.57 mmoles) was then added and the reaction mixture stirred for a further 45 minutes. The solution was then condensed and washed with sodium bicarbonate solution (sat., 3×100 ml) and distilled water (2×100 ml), dried over anhydrous sodium sulphate and evaporated to give crude 10,15,20-tetrakis{3',5'-bis[3",5"-bis(3"',5"'-di-t-butylstyryl)styryl]phenyl}porphyrin (601 mg, 14%) $\delta_H$(500 MHz; CDCl3) -2.51 (2H, s, NH), 1.31 (144H, s, tBu), 7.14 (16H, d, J 16, 7"'-H), 7.25 (16H, d, J 16, 8"'-H), 7.31 (16H, t, 1"'-H), 7.37 (32H, d, J 1.7, 3"',5"'-H), 7.49 (8H, d, J 16, 7"-H), 7.57 (8H, d, J 16, 8"-H), 7.63 (8 H, s, 1"-H), 7.66 (16H, s, 3",5"-H), 8.26 (4H, s, 1'-H), 8.40 (8H, s, 3',5'-H), 9.14 (8H, s, 2,3,7,8,12,13,17,18-H).

SECOND EXAMPLE

Dry dichloromethane (90 mL) was distilled into a flask containing pyrrole (58 μl, 0.86 mmoles) and 3,5-bis[3',5'- bis(3",5"-di-t-butylstyryl)styryl]]benzaldehyde (1.00 g, 0.86 mmoles) under nitrogen. Trifluoroacetic acid (66 µl, 0.86 mmoles) was then added and the reaction mixture stirred in the dark under nitrogen for 5 days. 2,3-dichloro-5,6-dicyano-1,4-quinone (146 mg, 0.64 mmoles) was then added and the reaction mixture stirred for a further 40 minutes. The solution was washed with saturated sodium bicarbonate solution and this aqueous fraction was extracted with dichloromethane (2×30 mL). The combined organic fractions were washed with distilled water (4×50 mL), dried over anhydrous sodium sulphate and evaporated. The crude product was chromatographed on flash silica using DCM-pet.ether (60–80) (3:17) as the eluent to give a brown solid of 2-porphyrin (249 mg, 24%), m.p. decomp. 292° C.; (Found: C, 89.05; H, 8.7; N, 1.1. $C_{364}H_{430}N_4$ requires C, 89.9; H, 8.9; N, 1.15%); $v_{max}$ (CHCl$_3$)/cm$^{-1}$ 3321 (NH), 1593 (C=C) and 964 (C=C—H trans); $\lambda_{max}$ (CHCl$_3$)/nm 320 (log $\epsilon$/dm$^3$ mol$^{-1}$ cm$^{-1}$ 5.86), 411 (5.06), 431 (5.78), 519 (4.42), 555 (4.01), 592 (3.89) and 648 (3.67); $\delta_H$(500 MHz; CDCl$_3$) −2.50 (2H, s, NH), 1.33 (144H, s, t-Bu), 7.17 and 7.28 (32H, d, J 16, G-2 vinyl H), 7.34 (16H, dd, J 2, sp H), 7.39 (32H, d, J 2, sp H), 7.52 and 7.60 (16H, d, J 16, G-1 vinyl H), 7.66 (8H, s, G-2 phenyl H), 7.69 (16H, s, G-2 phenyl H), 8.29 (4H, s, G-1 phenyl H), 8.43 (8H, s, G-1 phenyl H), 9.17 (8H, s, pyrrolic H); m/z (MALDI) 4861 (M+, 100%).

9,10-bis[3',5'-bis(3",5"-di-t-butylstyryl)styryl] anthracene (1-Anthracene)

FIRST EXAMPLE

Dry N,N-dimethylformamide (10 ml) was added to a rapidly stirred mixture of 9,10-bis(dimethylmethylphosphonate)anthracene (395 mg, 0.935 mmoles), potassium t-butoxide (220 mg, 1.963 mmoles) and 3,5-bis(3',5'-di-t-butylstyryl)benzaldehyde (1.000 g, 1.87 mmoles) under nitrogen and stirred at room temperature for 90 minutes. Distilled methanol (60 ml) was then added and the precipitate filtered and dried under suction. The crude product (925 mg) was recrystallized from dichloromethane-methanol and then chromatographed on flash silica using dichloromethane-pet. ether (40–60) (1:3) as the eluent. The solvent was removed to give 9,10-bis[3',5'-bis(3",5"-di-t-butylstyryl)styryl]anthracene (206 mg, 18%). lamdamax (film)/nm 308, 420.

SECOND EXAMPLE

Dry tetrahydrofuran (2 mL) was added to a rapidly stirred mixture of 9,10-bis(dimethylmethylphosphonate)anthracene (39.5 mg, 0.94 mmoles), potassium t-butoxide (22 mg, 0.20 mmoles) and 3,5-bis(3',5'-di-t-butylstyryl)benzaldehyde (100 mg, 0.19 mmoles) and stirred at room temperature for 85 minutes. The solvent was then removed and the crude product (925 mg) was chromatographed on flash silica using dichloromethane-pet. ether (40–60) (3:17) as the eluent. The solvent was removed to give a yellow solid of 1-anthracene (63 mg, 54%), m.p. decomp. 284–294° C. (Found: C, 90.6; H, 9.2. $C_{94}H_{110}$ requires C, 91.1; H, 8.9%); $v_{max}$ (CHCl$_3$)/cm$^{-1}$ 1593 (C=C) and 964 (C=C—H trans); $\lambda_{max}$ (CHCl$_3$)/nm 269 (log $\epsilon$/dm$^3$ mol$^{-1}$ cm$^{-1}$ 4.26), 318 (4.30) and 415 (3.60); $\delta_H$(400 MHz; CDCl$_3$) 1.40 (72H, s, t-Bu), 7.05 and 8.10 (4H, d, J 16, core vinyl H), 7.25 and 7.35 (8H, d, J 16, G-1 vinyl H), 7.40 (4H, dd, J 2, sp H), 7.42 (8H, d, J 2, sp H), 7.55 (4H, m, anthracenyl H), 7.76 (2H, s, branch cp H), 7.78 (4H, s, branch cp H), 8.10 (2H, d, J 16, 8'-H) and 8.50 (4H, m, anthracenyl H); m/z (MALDI) (M+, 100%).

9,10-bis{3',5'-bis[3",5"-bis(3'",5'"-di-t-butylstyryl) styryl]styryl}anthracene (2-Anthracene)

FIRST EXAMPLE

Dry tetrahydrofuran (10 ml) was added to a mixture of 9,10-bis(dimethylmethylphosphonate)anthracene (181 mg, 0.43 mmoles), 3,5-bis[3',5'-bis(3",5"-di-t-butylstyryl)styryl] benzaldehyde (1.000 g, 0.856 mmoles) and potassium t-butoxide (101 mg, 0.90 mmoles) and stirred at room temperature for 90 minutes. The reaction mixture was then poured into methanol (60 ml) and the precipitate filtered and recrystallized from dichloromethane-pet. ether (60–80) to give crude 9,10-bis{3',5'-bis[3",5"-bis(3'",5'"-di-t-butylstyryl)styryl]styryl}anthracene (661 mg, 62%). $\delta_H$(500 MHz; CDCl3) 1.40 (144H, s, tBu), 7.08 (2H, d, J 16, 7'-H), 7.20 (8H, d, J 16, 7'''-H), 7.32 (8H, d, J 16, 8'''-H), 7.39 (16H, s, 1''',7'',8''-H), 7.45 (16H, d, J 1.6, 3''', 5'''-H), 7.58 (4H, dd, J 3.2 and 6.9, 2,3,6,7-H), 7.67 (4H, s, 1''-H), 7.70 (8H, s, 3'',5''-H), 7.82 (2H, s, 1'-H), 7.84 (4H, s, 3',5'-H), 8.13 (2H, d, J 16, 8'-H), 8.52 (4H, dd, J 3.3 and 6.8, 1,4,5,8-H)

SECOND EXAMPLE

Dry tetrahydrofuran (1.5 mL) was added to a mixture of 9,10-bis(dimethylmethylphosphonate)anthracene (12 mg, 0.03 mmoles), 3,5-bis[3',5'-bis(3",5-"di-t-butylstyryl)styryl] benzaldehyde (66.3 mg, 0.06 mmoles) and potassium t-butoxide (7 mg, 0.06 mmoles) and stirred in the dark at room temperature for 75 minutes. The crude reaction mixture was evaporated onto silica and purified by Medium Pressure Liquid Chromatography using dichloromethane-pet. ether (60–80) (3:17) as the eluent to give a yellow solid of 2-anthracene (26 mg, 37%), m.p. decomp. 292° C.; (Found: C, 90.9; H, 9.25. $C_{190}H_{222}$ requires C, 91.1; H, 8.9%); $v_{max}$(CHCl$_3$)/cm$^{-1}$ 1593 (C=C) and 965 (C=C—H trans); $\lambda_{max}$(CHCl$_3$)/nm 271 (log $\epsilon$/dm$^3$ mol$^{-1}$ cm$^{-1}$ 4.91), 322 (5.24) and 413 (4.41); $\delta_H$(500 MHz; CDCl$_3$) 1.40 (144H, s, t-Bu), 7.08 and 8.13 (4H, d, J 16, core vinyl H), 7.20 and 7.32 (16H,, d, J 16, G-2 vinyl H), 7.39 (16H, s, sp and G-1 vinyl H), 7.45 (16H, d, J 2, sp H), 7.58 (4H, m, anthracenyl H), 7.67 (4H, s, G-1 phenyl H), 7.70 (8H, s, G-1 phenyl H), 7.82 (2H, s, branch cp H), 7.84 (4H, s, branch cp H), 8.52 (4H, m, anthracenyl H); m/z (MALDI) 2505 (M+, 100%).

The invention is further illustrated by the following Summary Table, which indicates some of the different colours achievable and the increase in different external quantum efficiencies $QE_{ext}$ with different dendritic generations in the branches of dendrimers incorporated in a light emitting device with contact of the indicated metal.

SUMMARY TABLE

| (N-class) Dendrimer | λmax (EL) (nm) | $QE_{ext}$ (%) | Contact |
|---|---|---|---|
| 1-DSB | 510 | 0.01 | Ca |
| 2-DSB | 460 | 0.09 | Ca |
| 3-DSB | | 0.03 | Ca |
| 1-Anthracene | 590 | | Ca |
| | | 0.02 | Al |
| 2-Anthracene (impure) | 590 | | Ca |
| | | 0.04 | Al |
| 1-Porphyrin | 670 | 0.02 | Ca |
| | 734 | 0.02 | Al |
| 2-Porphyrin (impure) | 670 | | Ca |
| | 734 | 0.04 | Al |

Device 1

1-DSB (10 mg) in spectrophotometric grade chloroform (0.5 ml) was spin-coated at 1900 RPM for 60 seconds onto an ITO covered glass slide to give a thickness of 150 nm. The sample was immediately transferred to the evaporator. Calcium (100 nm) and aluminium (80 nm) were then sequentially deposited to complete the device. The external quantum efficiency was found to be 0.01%.

Device 2

2-DSB (10 mg) in spectrophotometric grade chloroform (0.5 ml) was spin-coated at 1900 RPM for 60 seconds onto an ITO covered glass slide to give a thickness of 140 nm. The sample was immediately transferred to the evaporator. Calcium (100 nm) and aluminium (80 nm) were then sequentially deposited to complete the device. The external quantum efficiency was found to be 0.09%.

Device 3

1-Anthracene (12 mg) in spectrophotometric grade chloroform (0.5 ml) was spin-coated at 1900 RPM for 60 seconds onto an ITO covered glass slide to give a thickness of 220 nm. The sample was immediately transferred to the evaporator. Aluminium (100 nm) was then deposited to complete the device. The external quantum efficiency was found to be 0.02%.

Device 4

1-Porphyrin (9 mg) in spectrophotometric grade chloroform (0.5 ml) was spin-coated at 1900 RPM for 60 seconds onto an ITO covered glass slide to give a thickness of 150 nm. The sample was immediately transferred to the evaporator. Aluminium (100 nm) was then deposited to complete the device. The external quantum efficiency was found to be 0.02%.

The dendrimers according to this invention are not necessarily pure compounds. Working light emitting device can be made using dendrimers containing impurities generated during the synthesis, which may in some cases be difficult to remove.

What is claimed is:

1. A luminescent compound of the formula:

CORE-[DENDRITE]$_n$ in which CORE represents an atom or group, n represents an integer of at least 1 and DENDRITE, which may be the same or different if n is greater than 1, represents an at least partly conjugated dendritic molecular structure comprising groups selected from the group consisting of aryl and heteroaryl groups and alkenyl groups connected to each other via a carbon atom of an alkenyl group to a ring carbon atom of an aryl or heteroaryl group, CORE terminating in a first single bond which is connected to a ring carbon atom of an (hetero)aryl group to which more than one at least partly conjugated dendritic chain is attached, said ring carbon atom of an (hetero)aryl group forming part of DENDRITE, and wherein (a) the CORE is not

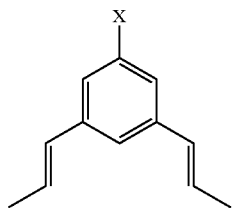

wherein X is bromine or CHO when n=2, (b) the CORE is not bromine or CHO when n=1 and is attached to

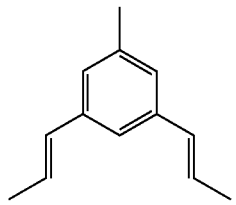

and (c) the CORE does not contain the structure

ø$_t$—[—CH=CH-ø$_p$—CH=CH—]$_3$ in which ø$_t$ is a 1,3,5-bonded benzene ring and ø$_p$ is a para-bonded benzene ring.

2. A compound according to claim 1 which is luminescent in the solid state.

3. A compound according to claim 2 which emits light in the visible region under electrical or optical excitation.

4. A compound according to claim 1 which has more than one luminescent group and the energy resulting from electrical or optical excitation is transferred to one of them for light emission.

5. A compound according to claim 1 which has at least two at-least-partly-conjugated luminescent groups, wherein each said DENDRITE includes at least one of the said luminescent groups, the luminescent group or groups further from the CORE being of larger HOMO-LUMO energy gap than the luminescent group or groups closer to or partly or wholly within the CORE.

6. A compound according to claim 5, wherein each DENDRITE contains more than one luminescent group with those luminescent groups further from the CORE having larger HOMO-LUMO energy gaps than those closer to the CORE.

7. A compound according to claim 5 wherein one of the luminescent group or groups is partly or wholly within, or constitutes, the CORE itself and has a smaller HOMO-LUMO energy gap than the other luminescent group or groups in the DENDRITE.

8. A compound according to claim 1 wherein the CORE is not luminescent.

9. A compound according to claim 8, wherein the CORE is not luminescent and the luminescent group or groups further from the CORE have larger HOMO-LUMO energy gaps than those closer to the CORE.

10. A compound according to claim 1 wherein a first aryl group of DENDRITE is a 1,3,5-bonded benzene ring.

11. A compound according to claim 1 wherein n is 2 and the DENDRITE units are attached in a para position to an aromatic CORE.

12. A compound according to claim 1 wherein CORE comprises at least two aromatic rings which are not fused to one another.

13. A compound according to claim 1 wherein CORE does not possess any halogen atom attached to an aromatic ring.

14. A compound according to claim 1 wherein CORE comprises a distyryl anthracene, porphyrin or distyrylbenzene moiety.

15. A compound according to claim 1 wherein CORE comprises a moiety of benzene, pyridine, pyrimidine, triazine, thiophene, divinylbenzene, distyrylethylene, divinylpyridine, pyrimidine, triazine, divinylthiophene, oxadiazole, coronene, or a triarylamine or a fluoroescent dye or marker compound.

16. A compound according to claim 1, wherein n is two to six.

17. A compound according to claim 1 wherein each DENDRITE is at least partly conjugated with CORE.

18. A compound according to claim 1, wherein the (hetero)aryl moieties in DENDRITE are benzene rings coupled at ring positions 1, 3 and 5, or are pyridyl, triazinyl or thiophenyl rings.

19. A compound according to claim 1 wherein at least one group on the surface of the compound is attached to a distal aryl ring carbon atom of DENDRITE, said group being an alkene, (meth)acrylate, sulphur-containing, or silicon-containing group; sulphonyl group; polyether group; $C_1$-to-$C_{15}$ alkyl group; unsubstituted amine group; mono-, di- or tri-$C_1$-to-$C_{15}$ alkyl amine group; —COOR group wherein R is hydrogen or $C_1$-to-$C_{15}$ alkyl; —OR group wherein R is hydrogen, aryl, or $C_1$-to-$C_{15}$ alkyl or alkenyl; —$O_2$SR group wherein R is $C_1$-to-$C_{15}$ alkyl or alkenyl; —$SiR_3$ groups wherein the R groups are the same or different and are a hydrogen, $C_1$-to-$C_{15}$ alkyl or alkenyl, or —SR group (R is aryl or $C_1$-to-$C_{15}$ alkyl or alkenyl), aryl, or heteroaryl.

20. A compound according to claim 19 wherein the groups on the surface of the compound are t-butyl groups.

21. A compound according to claim 1 wherein the DENDRITE structures consist of the alkenyl and aryl units coupled together by conjugated linkages in 1st, 2nd, or 3rd (or higher) generation structures of a general formula selected from the group consisting of

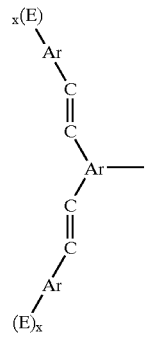

which is the first generation which is denoted by A,

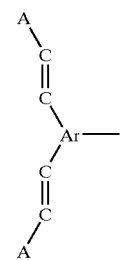

which is the second generation which is denoted by B,

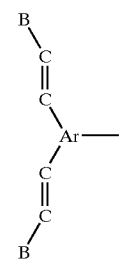

which is of the third generation, in which x is 1, 2, or 3 and E is a surface group which may be the same or different if more than one.

22. A compound according to claim 1 incorporating one or more electron-withdrawing groups which increase its electron-transporting properties.

23. A compound according to claim 1 for use as a light-emitting element in an electrically-actuated light-emitting diode.

* * * * *

UNITED STATES PATENT AND TRADEMARK OFFICE
CERTIFICATE OF CORRECTION

PATENT NO.     : 6,558,818 B1
DATED          : May 6, 2003
INVENTOR(S)    : Ifor David Samuel et al.

It is certified that error appears in the above-identified patent and that said Letters Patent is hereby corrected as shown below:

<u>Title page,</u>
Item [30], Foreign Application Priority Data, the October 23, 1997 British application should be changed from "9722347" to -- 9722348 --

Figure 9:
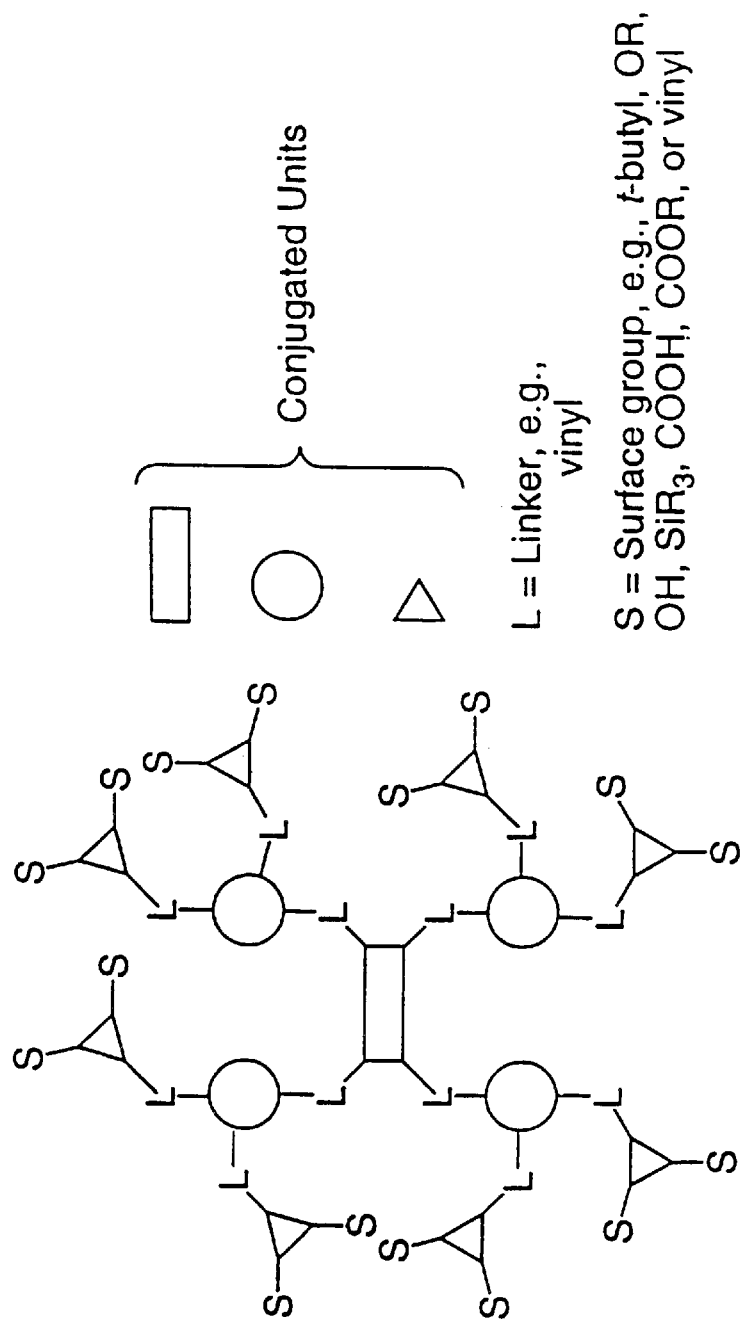
FIG. 9 illustrates diagrammatically the parts of a dendrimer.

<u>Column 1,</u>
Line 52, change "accoumpanying FIG. 9" to -- accompanying FIG. 9 --.

Signed and Sealed this

Eighth Day of July, 2003

JAMES E. ROGAN
*Director of the United States Patent and Trademark Office*